(12) United States Patent
Nishikawa et al.

(10) Patent No.: US 10,756,106 B2
(45) Date of Patent: Aug. 25, 2020

(54) THREE-DIMENSIONAL MEMORY DEVICE WITH LOCALLY MODULATED THRESHOLD VOLTAGES AT DRAIN SELECT LEVELS AND METHODS OF MAKING THE SAME

(71) Applicant: SANDISK TECHNOLOGIES LLC, Addison, TX (US)

(72) Inventors: Masatoshi Nishikawa, Nagoya (JP); Michiaki Sano, Ichinomiya (JP); Ken Oowada, Fujisawa (JP); Zhixin Cui, Nagoya (JP)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 16/202,713

(22) Filed: Nov. 28, 2018

(65) Prior Publication Data

US 2020/0168623 A1    May 28, 2020

(51) Int. Cl.
*H01L 27/11582* (2017.01)
*H01L 27/11556* (2017.01)
*H01L 21/8234* (2006.01)
*H01L 27/11524* (2017.01)
*H01L 27/1157* (2017.01)

(52) U.S. Cl.
CPC ......... *H01L 27/11582* (2013.01); *H01L 21/823487* (2013.01); *H01L 27/1157* (2013.01); *H01L 27/11524* (2013.01); *H01L 27/11556* (2013.01)

(58) Field of Classification Search
CPC . H01L 51/56; H01L 51/0072; H01L 51/5012; H01L 51/5016; H01L 51/5253
USPC ........................................... 257/314
See application file for complete search history.

(56) References Cited

U.S. PATENT DOCUMENTS

| | | | |
|---|---|---|---|
| 5,915,167 A | 6/1999 | Leedy | |
| 2016/0163725 A1* | 6/2016 | Kamiya | ............ H01L 27/11521 257/321 |
| 2017/0278571 A1 | 9/2017 | Chowdhury et al. | |
| 2018/0053774 A1* | 2/2018 | Sakamoto | ......... H01L 27/11556 |
| 2018/0233513 A1 | 8/2018 | Zhang et al. | |

OTHER PUBLICATIONS

U.S. Appl. No. 15/850,073, filed Dec. 21, 2017, SanDisk Technologies LLC.
U.S. Appl. No. 16/019,821, filed Jun. 27, 2018, SanDisk Technologies LLC.

(Continued)

*Primary Examiner* — Andy Huynh
(74) *Attorney, Agent, or Firm* — The Marbury Law Group, PLLC

(57) ABSTRACT

A three-dimensional memory device includes an alternating stack of insulating layers and electrically conductive layers containing word lines and drain select gate electrodes located over a substrate, and memory stack structures containing a respective vertical semiconductor channel and a memory film including a tunneling dielectric and a charge storage layer. A first portion of a first charge storage layer located in a first memory stack structure at level of a first drain select gate electrode is thicker than a first portion of a second charge storage layer located in a second memory stack structure at the level of the first drain select electrode.

8 Claims, 39 Drawing Sheets

(56) References Cited

OTHER PUBLICATIONS

U.S. Appl. No. 16/019,856, filed Jun. 27, 2018, SanDisk Technologies LLC.
Endoh et al., "Novel Ultra High Density Memory with a Stacked-Surrounding Gate Transistor (S-SGT) Structured Cell," IEDM Proc., (2001), 33-36.

* cited by examiner

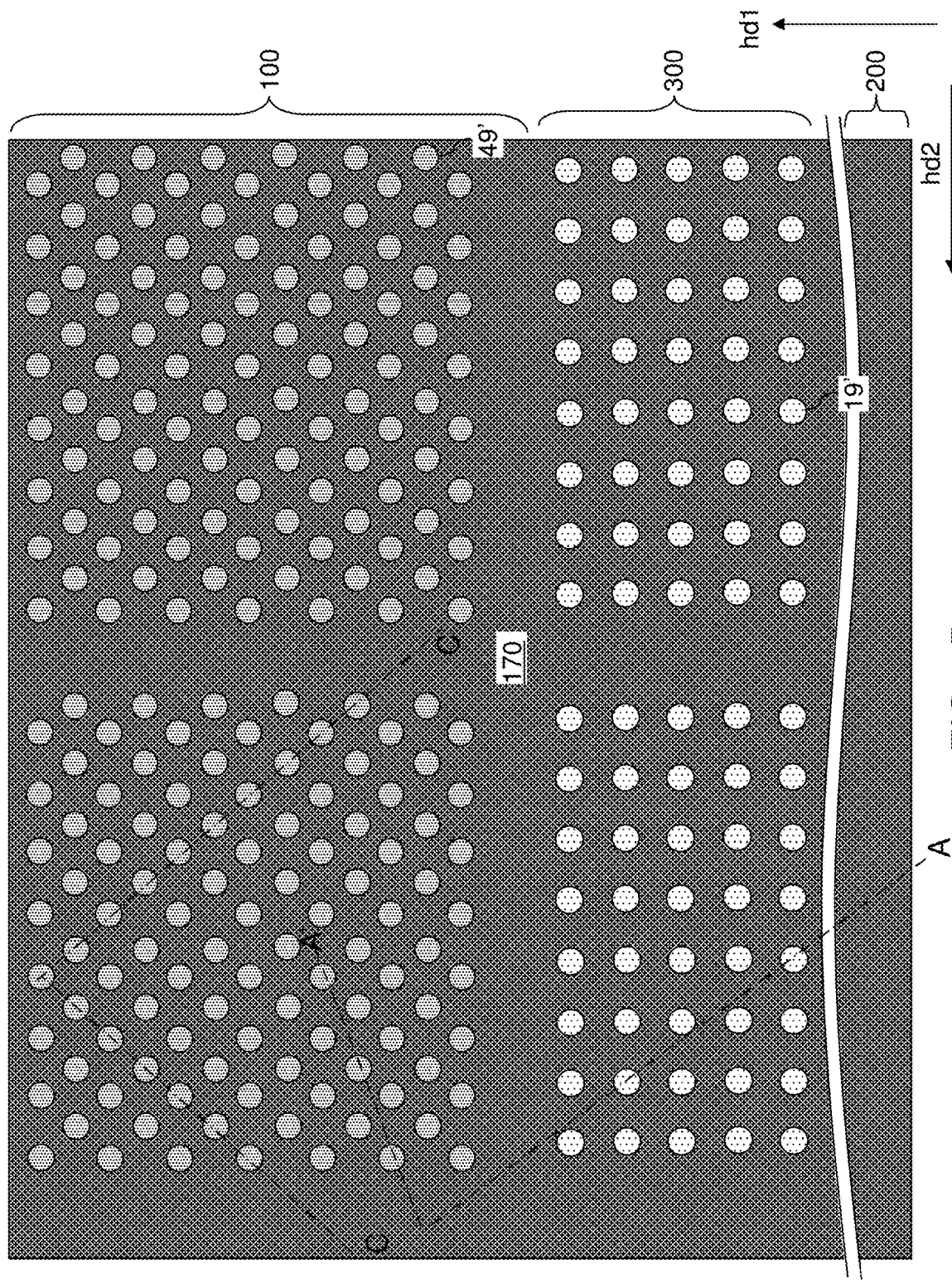

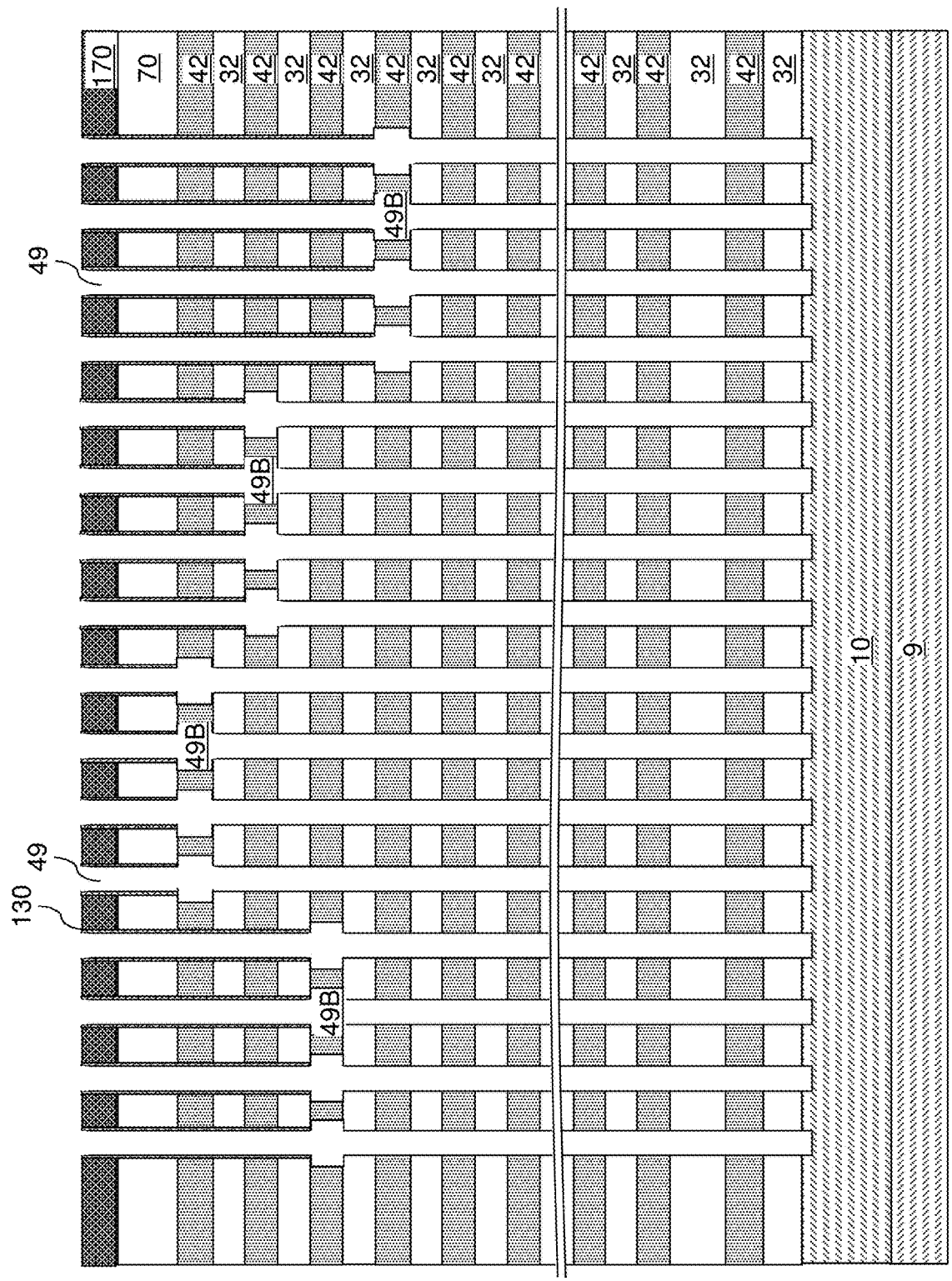

THREE-DIMENSIONAL MEMORY DEVICE WITH LOCALLY MODULATED THRESHOLD VOLTAGES AT DRAIN SELECT LEVELS AND METHODS OF MAKING THE SAME

FIELD

The present disclosure relates generally to the field of semiconductor devices, and particularly to three-dimensional memory devices with locally modulated threshold voltages at drain select levels and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell," IEDM Proc. (2001) 33-36.

SUMMARY

According to an aspect of the present disclosure, a three-dimensional memory device includes an alternating stack of insulating layers and electrically conductive layers containing word lines and drain select gate electrodes located over a substrate, and memory stack structures containing a respective vertical semiconductor channel and a memory film including a tunneling dielectric and a charge storage layer. A first portion of a first charge storage layer located in a first memory stack structure at level of a first drain select gate electrode is thicker than a first portion of a second charge storage layer located in a second memory stack structure at the level of the first drain select electrode.

According to another aspect of the present disclosure, a method of forming a three-dimensional memory device is provided, which comprises: forming an alternating stack of insulating layers and sacrificial material layers over a substrate; forming multiple sets of memory openings through the alternating stack, wherein each set of memory openings has at least one laterally bulging region at a level of a respective at least one of the sacrificial material layers and each of the memory openings has one or more laterally bulging regions only at a level of one drain select transistor; forming a memory film within each of the memory openings, wherein each memory film has a respective laterally bulging portion located within a respective one of the laterally bulging regions of the memory openings; forming a vertical semiconductor channel on each of the memory films; and replacing the sacrificial material layers with electrically conductive layers.

BRIEF DESCRIPTION OF THE DRAWINGS

FIG. 4B is a vertical cross-sectional view of the exemplary structure along the hinged vertical plane B-B' of FIG. 4A. The horizontal plane B-B' is the plane of the horizontal cross-sectional view of FIG. 4A.

FIGS. 5A-5H are sequential vertical cross-sectional views of the exemplary structure along a hinged vertical plane corresponding to the hinged vertical plane C-C' of FIG. 4B during formation of bulged memory openings according to an embodiment of the present disclosure.

DETAILED DESCRIPTION

Figure 1:
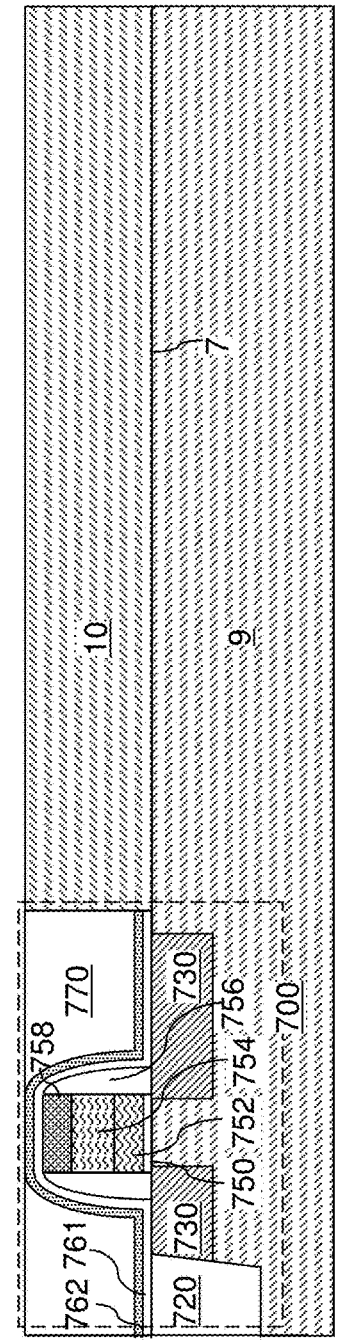
FIG. 1 is a vertical cross-sectional view of a first exemplary structure after formation of at least one peripheral device and a semiconductor material layer according to a first embodiment of the present disclosure.

As discussed above, the present disclosure is directed to three-dimensional memory devices with locally modulated threshold voltages at drain select levels and methods of manufacturing the same, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first", "second", and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow. As used herein, a "level" of an element refers to a spatial extent defined by a first horizontal plane including a topmost surface of the element and a second horizontal plane including a bottommost surface of the element. If an element is located over a substrate, the "level" of the element refers to a spatial extent defined by a vertical distance from the substrate that is less than a first vertical distance between the topmost surface of the element and a top surface of the substrate and greater than a second vertical distance between the bottommost surface of the element and the top surface of the substrate.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from $1.0$ S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
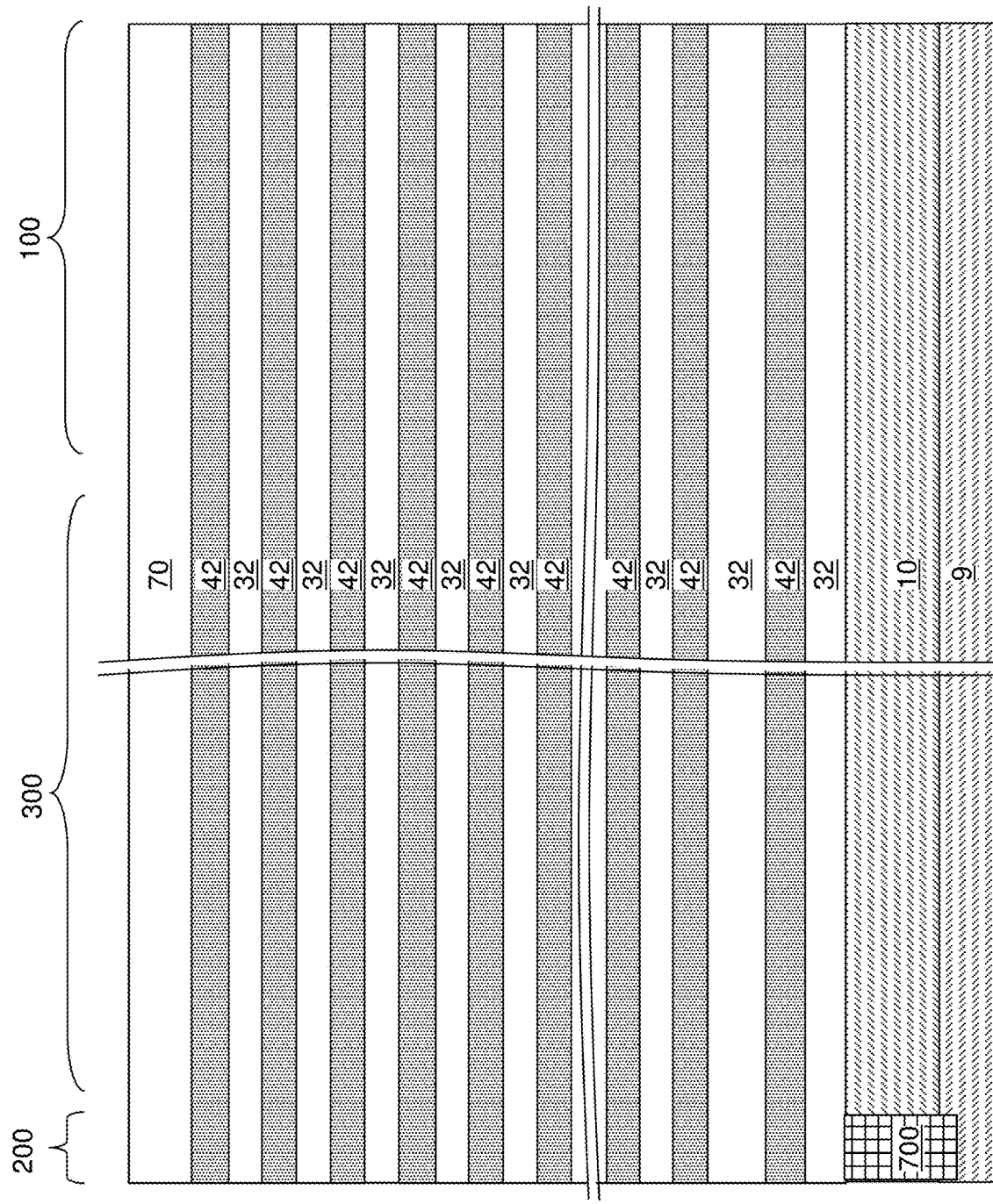
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3A:
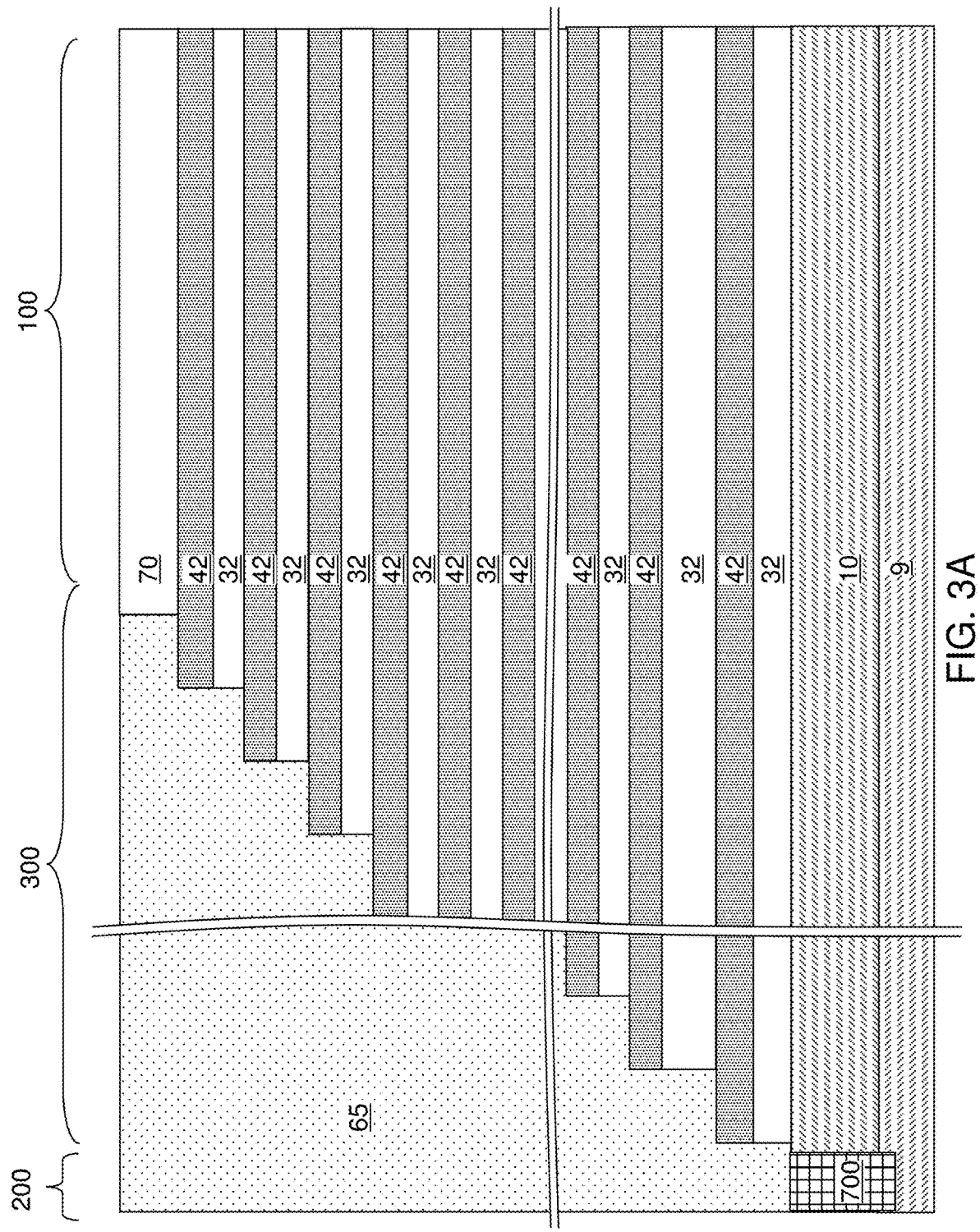
FIG. 3A is a schematic vertical cross-sectional view of the exemplary structure after formation of stepped terraces and a retro-stepped dielectric material portion according to an embodiment of the present disclosure.
Figure 3B:
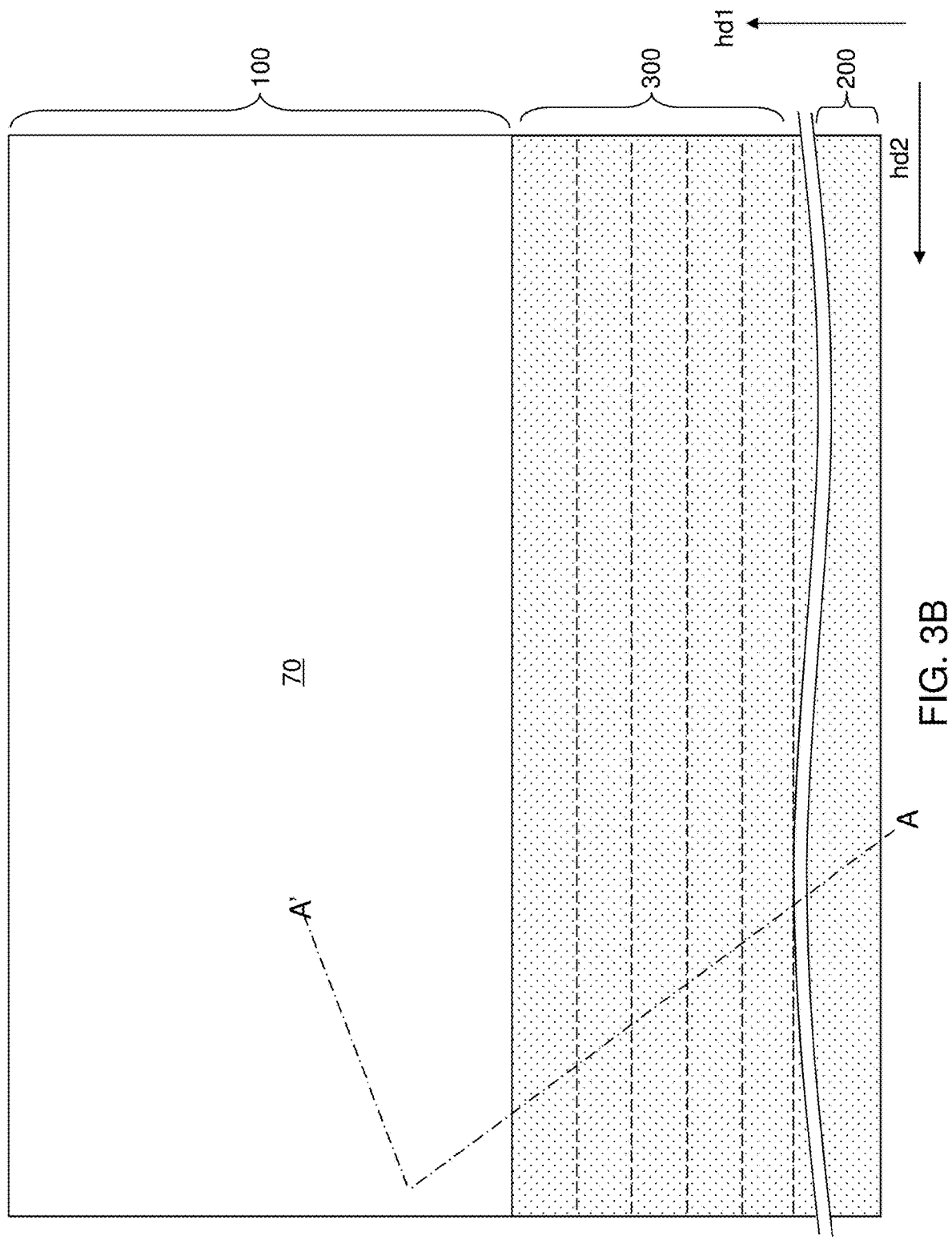
FIG. 3B is a vertical cross-sectional view of the exemplary structure along the hinged vertical plane B-B' of FIG. 3A. The horizontal plane B-B' is the plane of the horizontal cross-sectional view of FIG. 3A.

Referring to FIGS. 3A and 3B, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42)

to a topmost layer within the alternating stack (32, 42). In one embodiment, the vertical steps of the stepped surfaces may be perpendicular to a first horizontal direction hd1, and may be parallel to a second horizontal direction hd2 that is perpendicular to the first horizontal direction hd1.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4A:
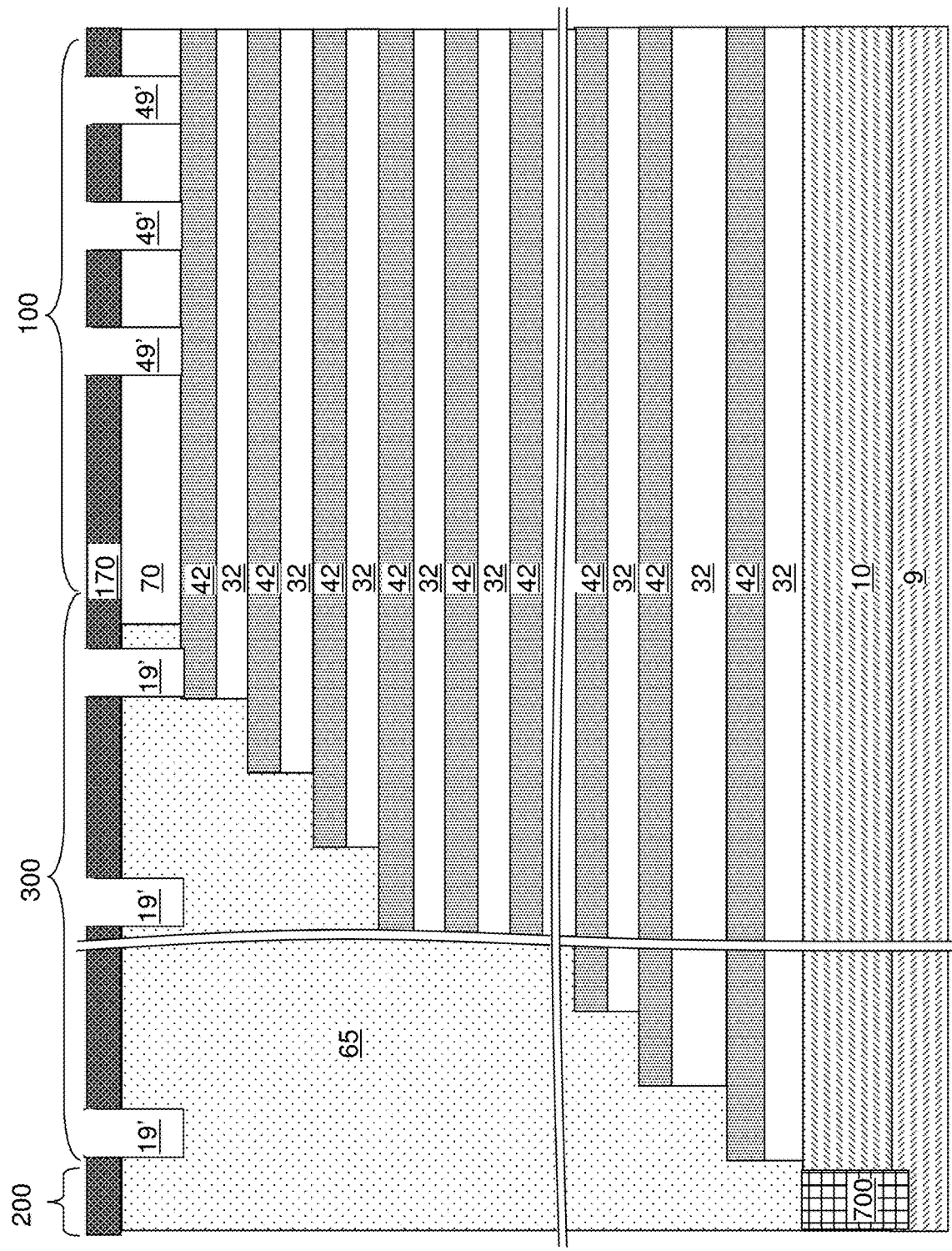
FIG. 4A is a vertical cross-sectional view of the exemplary structure after formation of a patterned hard mask layer and transfer of the pattern in the hard mask layer into an insulating cap layer according to an embodiment of the present disclosure.
Figure 4C:
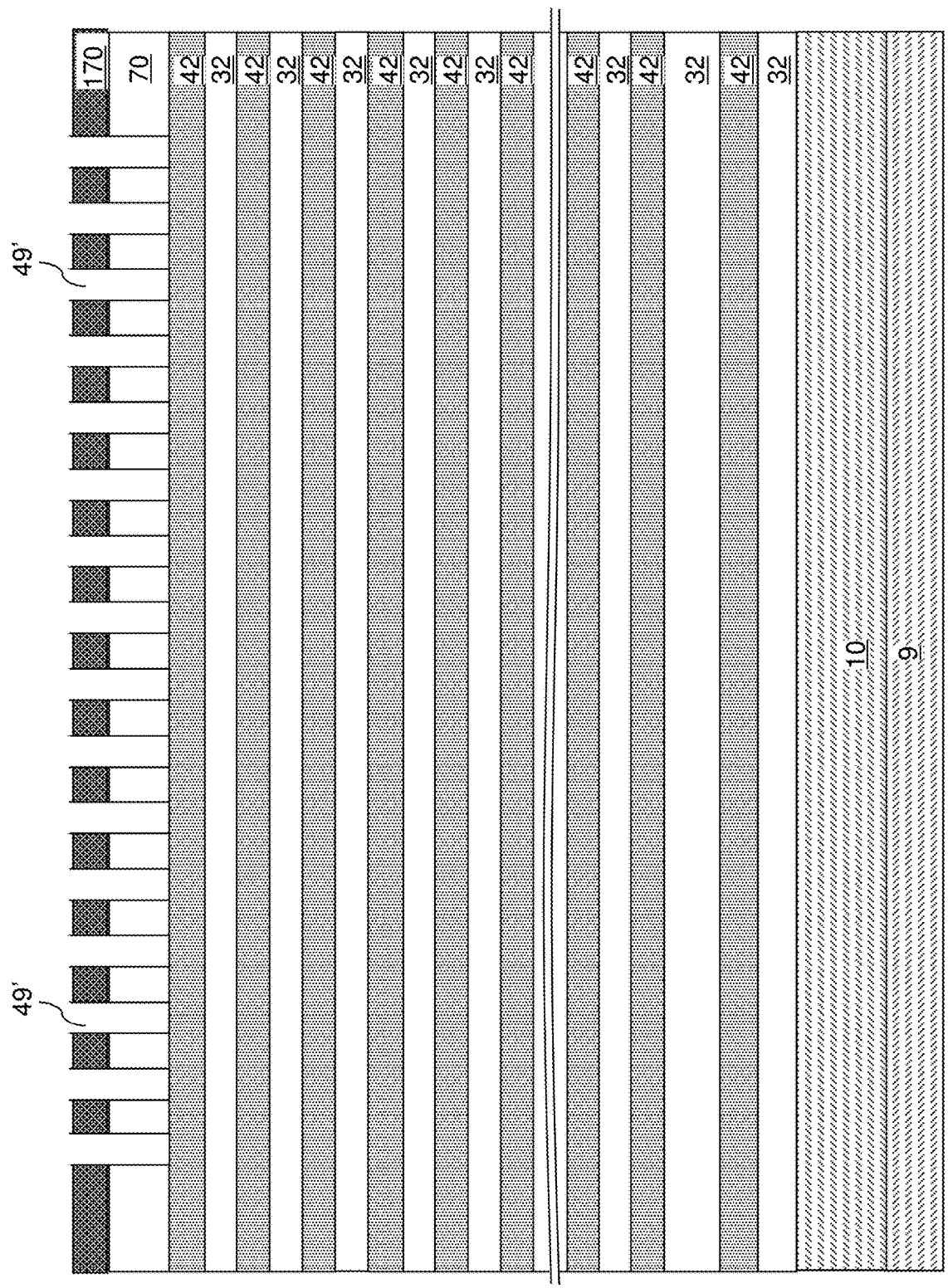
FIG. 4C is a vertical cross-sectional view of the exemplary structure of FIGS. 4A and 4B along the hinged vertical plane C-C' of FIG. 4B.

Referring to FIGS. 4A-4C, a hard mask layer 170 is formed over the insulating cap layer 70 and the retro-stepped dielectric material portion 65. The hard mask layer 170 can include at least one material selected from a semiconductor material (such as polysilicon, amorphous silicon, or a silicon germanium alloy), a patterning film (that can be based on amorphous carbon), or a dielectric material (such as silicon nitride or a dielectric metal oxide). In one embodiment, the hard mask layer 170 includes a polysilicon layer. In one embodiment, the hard mask layer 170 can include a layer stack to facilitate subsequent removal selective to the semiconductor material layer 10. The thickness of the hard mask layer 170 can be in a range from 50 nm to 500 nm, although lesser and greater thicknesses can also be employed. The hard mask layer 170 may be deposited by a conformal or a non-conformal deposition process.

A lithographic material stack (not shown) including at least a photoresist layer can be formed over the hard mask layer 170, and can be lithographically patterned to form openings therein. The openings include a first set of openings formed over the memory array region 100 and a second set of openings formed over the contact region 300. The pattern in the lithographic material stack can be transferred through hard mask layer 170, the insulating cap layer 70, and portions of the retro-stepped dielectric material portion 65 located at the level of the insulating cap layer 70 by at least one anisotropic etch that employs the patterned lithographic material stack as an etch mask. A terminal portion of the anisotropic etch process can stop on the material of the sacrificial material layers 42. For example, if the sacrificial material layers 42 include silicon nitride, the terminal portion of the anisotropic etch process can stop on silicon nitride.

Via cavities (49', 19') are formed through the hard mask layer 170, the insulating cap layer 70, and an upper portion of the retro-stepped dielectric material portion 65 located at the level of the insulating cap layer 70. Specifically, memory via cavities 49' are formed by transferring the pattern of the first set of openings in the photoresist layer through the hard mask layer 170 and the insulating cap layer 70. The memory via cavities 49' are subsequently vertically extended and locally expanded to form memory openings. Support via cavities 19' are formed by transferring the pattern of the second set of openings in the photoresist layer through the hard mask layer 170 and the upper portion of the retro-stepped dielectric material portion 65. The support via cavities 19' are subsequently vertically extended to form support openings. The photoresist layer can be removed, for example, by ashing.

As shown in FIG. 4B, multiple parallel rows of memory via cavities 49' are formed in the memory array region 100. Memory via cavities 49' within each row are arranged along the first horizontal direction hd1 (e.g., word line direction). The multiple parallel rows are laterally spaced apart along the second horizontal direction hd2 (e.g., bit line direction). The memory via cavities 49' can be formed in clusters of periodic two-dimensional arrays. Each periodic two-dimensional array of memory via cavities 49' (i.e., each cluster of memory via cavities 49') can have a first periodicity along the first horizontal direction hd1 and a second periodicity along the second horizontal direction hd2. Neighboring clusters of memory via cavities 49' can be laterally spaced apart along the second horizontal direction hd2.

Figure 5A:
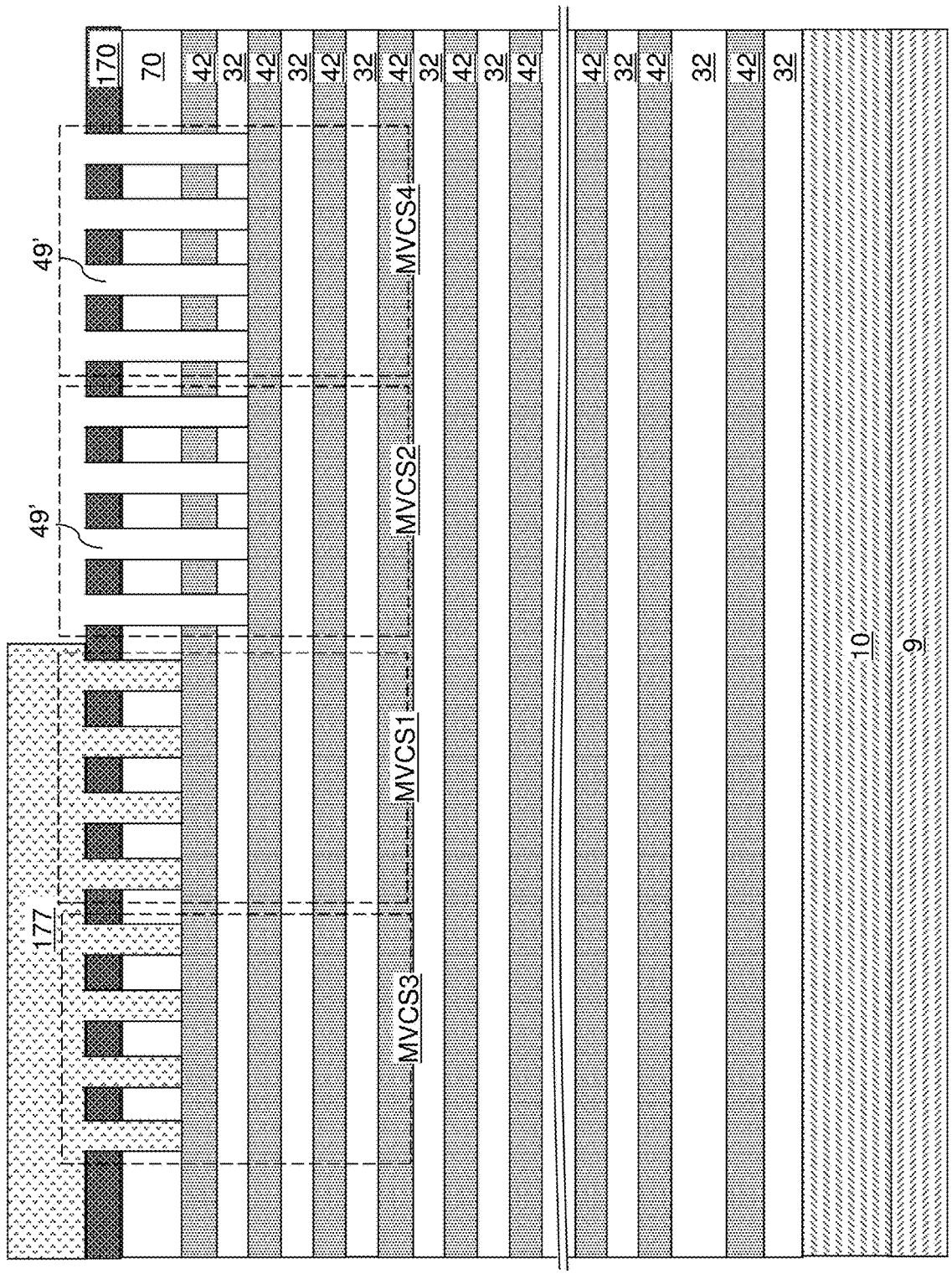

Referring to FIG. 5A, a first photoresist layer 177 is applied over the hard mask layer 170, and is lithographically patterned to cover the peripheral device region 200, the contact region 300, and a first area of the memory array region 100 while not covering a second area of the memory array region 100. In one embodiment, the first area of the memory array region 100 covered by the first photoresist layer 177 can include areas of a first subset MVCS1 of memory via cavities 49' and a third subset MVCS3 of memory via cavities 49' within each cluster of memory via cavities 49', and the second area of the memory array region 100 that is not covered by the first photoresist layer 177 can include areas of a second subset MVCS2 of memory via cavities 49' and a fourth subset MVCS4 of memory via cavities 49' within each cluster of memory via cavities 49'.

Each of the first subset MVCS1, the second subset MVCS2, the third subset MVCS3, and the fourth subset MVCS4 within a cluster of memory via cavities 49' can be laterally spaced apart along the second horizontal direction hd2. In one embodiment, each of first subset MVCS1, the second subset MVCS2, the third subset MVCS3, and the fourth subset MVCS4 within a cluster of memory via cavities 49' can be located within a respective rectangular area that laterally extend lengthwise along the first horizontal direction hd1 and laterally extend widthwise along the second horizontal direction hd2. While the present disclosure is described employing an embodiment in which each cluster of memory via cavities 49' includes four subsets of memory via cavities 49', embodiments are expressly contemplated herein in which each cluster of memory via cavities 49' includes two, three, five, six, or more subsets of memory via cavities 49'.

An anisotropic etch process is performed to vertically extend the subsets (MVCS2, MVCS4) of memory via cavities 49' that are not covered by the first photoresist layer 177 through a topmost sacrificial material layer 42 and a topmost insulating layer 32. The anisotropic etch process can include a first etch step that etches the material of the topmost sacrificial material layer 42 selective to the material of the topmost insulating layer 32, and a second etch step that etches the material of the topmost insulating layer 32 selective to the material of the second-from-the-top sacrificial material layer 42. As used herein, a "second-from-the-top" element refers to an element that is located directly below a topmost one of similar elements and above all other ones of the similar elements. As used herein, a "second-from-the-bottom" element refers to an element that is located directly above a bottommost one of similar elements and below all other ones of the similar elements. Each memory via cavity 49' that is not covered by the first photoresist layer 177 is vertically extended through the topmost sacrificial material layer 42 and the topmost insulating layer 32. Thus, each memory via cavity 49' within the second subset MVCS2 and the fourth subset MVCS4 of memory via cavities 49' in each cluster of memory via cavities 49' is vertically extended to a top surface of the second-from-the-top sacrificial material layer 42. The first photoresist layer 177 can be subsequently removed, for example, by ashing or dissolution in a chemical solvent.

Figure 5B:
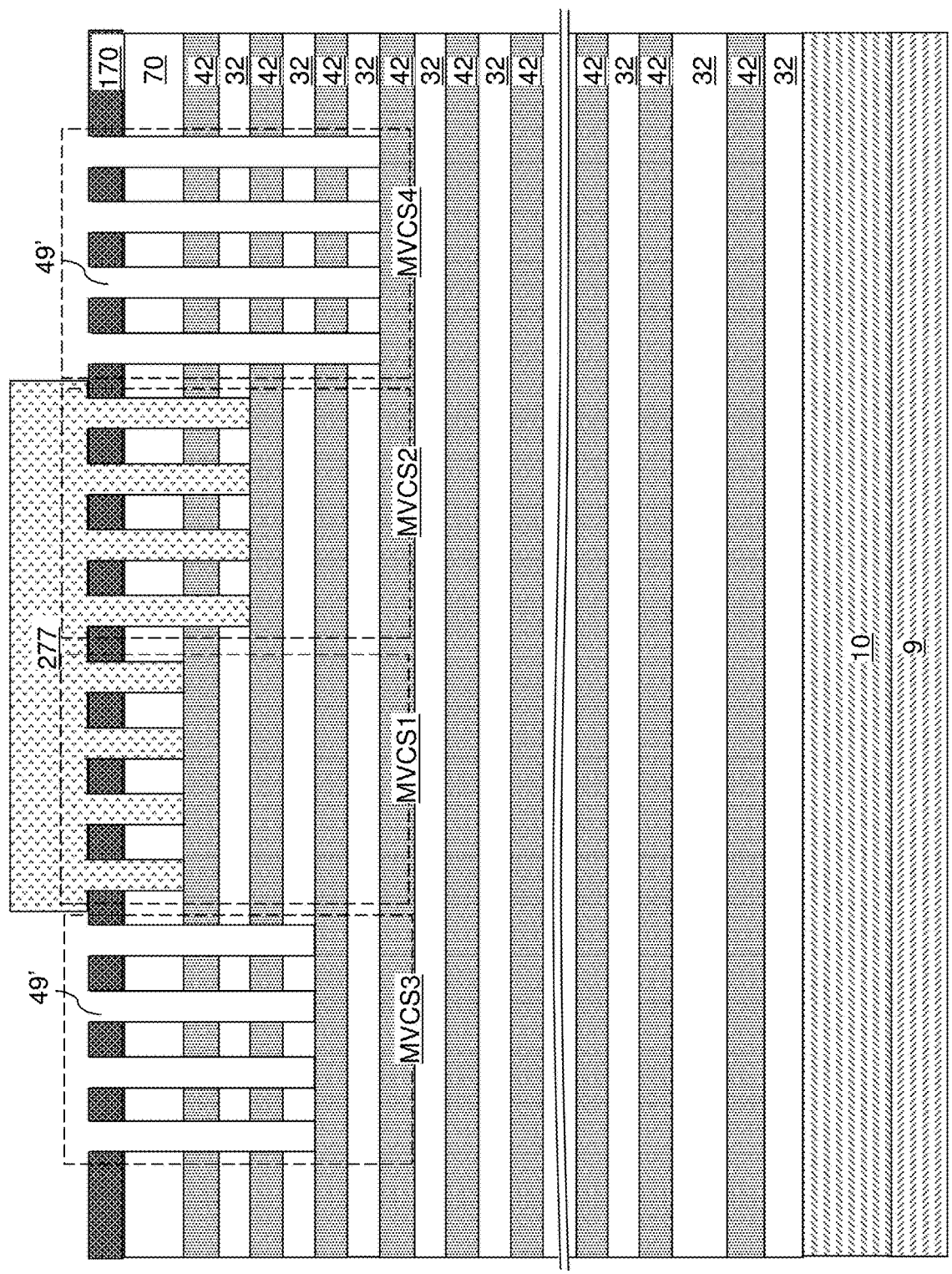

Referring to FIG. 5B, a second photoresist layer 277 is applied over the hard mask layer 170, and is lithographically patterned to cover the peripheral device region 200, the contact region 300, and a third area of the memory array region 100 while not covering a fourth area of the memory array region 100. In one embodiment, the third area of the memory array region 100 covered by the second photoresist layer 277 can include areas of the first subset MVCS1 of memory via cavities 49' and the second subset MVCS2 of memory via cavities 49' within each cluster of memory via cavities 49', and the fourth area of the memory array region 100 that is not covered by the second photoresist layer 277 can include areas of the third subset MVCS3 of memory via cavities 49' and the fourth subset MVCS4 of memory via cavities 49' within each cluster of memory via cavities 49'.

An anisotropic etch process is performed to vertically extend the subsets (MVCS3, MVCS4) of memory via cavities 49' that are not covered by the second photoresist layer 277 through a pair of underlying sacrificial material layers 42 and a pair of insulating layers 32. The anisotropic etch process can include a first etch step that etches through the material of a sacrificial material layer 42 selective to the material of an underlying insulating layer 32, a second etch step that etches through the material of an insulating layer 32 selective to the material of an underlying sacrificial material layer 42, a third etch step that etches through the material of a sacrificial material layer 42 selective to the material of an underlying insulating layer 32, and a fourth etch step that etches through the material of an insulating layer 32 selective to the material of an underlying sacrificial material layer 42.

Each memory via cavity 49' that is not covered by the second photoresist layer 277 is vertically extended through two immediately underlying pairs of sacrificial material layers 42 and two immediately underlying pairs of insulating layers 32. Thus, each memory via cavity 49' within the third subset MVCS3 and the fourth subset MVCS4 of memory via cavities 49' in each cluster of memory via cavities 49' is vertically extended by a depth that is the same as the sum of the thicknesses of the two immediately underlying pairs of insulating layers 32 and the thickness of the two immediately underlying sacrificial material layers 42. The second photoresist layer 277 can be subsequently removed, for example, by ashing or dissolution in a chemical solvent.

Generally, multiple sets (MVCS1, MVCS2, MVCS3, MVCS4) of memory via cavities 49' are formed through an upper portion of the alternating stack (32, 42). Different sets of the memory via cavities 49' extend to top surfaces of different sacrificial material layers 42 within the alternating stack (32, 42). For example, each memory via cavity 49' within the first subset MVCS1 vertically extends down to a top surface of the topmost sacrificial material layer 42, each memory via cavity 49' within the second subset MVCS2 vertically extends down to a top surface of the second-from-the-top sacrificial material layer 42, each memory via cavity 49' within the third subset MVCS3 vertically extends down to a top surface of a third-from-the-top sacrificial material layer 42, and each memory via cavity 49' within the fourth subset MVCS4 vertically extends down to a top surface of a fourth-from-the-top sacrificial material layer 42.

Figure 5C:
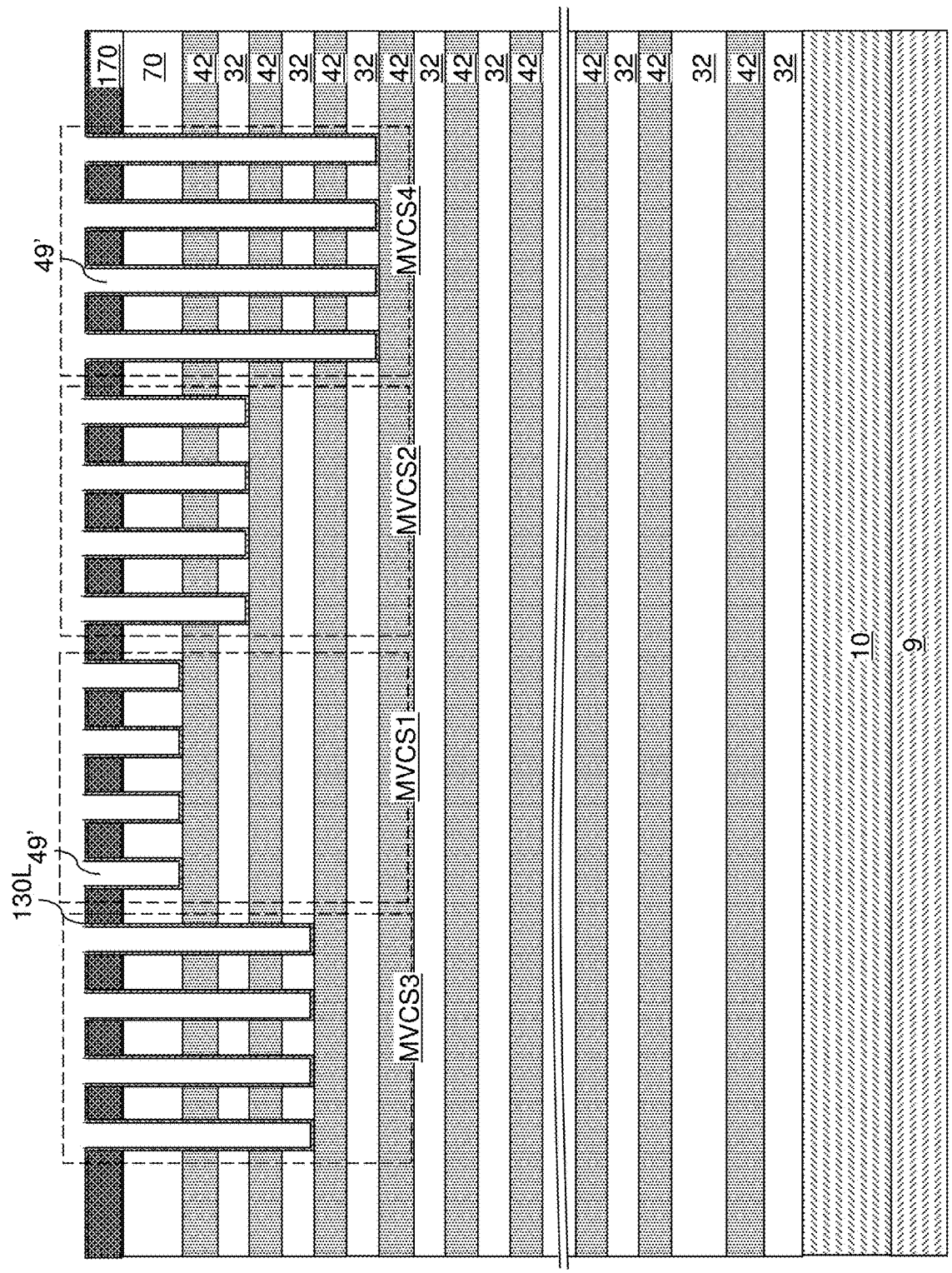

Referring to FIG. 5C, a sacrificial protective material can be conformally deposited to form a sacrificial protective material layer 130L. The sacrificial protective material is a material that can protect the sacrificial material layers 42 during a subsequent isotropic etch process. For example, the sacrificial protective material can include a dielectric material such as silicon oxide or a semiconductor material such as amorphous silicon. The conformal deposition of the sacrificial protective material layer 130L can be performed, for example, by low pressure chemical vapor deposition. The thickness of the sacrificial protective material layer 130L can be in a range from 5 nm to 30 nm, such as from 6 nm to 15 nm, although lesser and greater thicknesses can be employed. In one embodiment, the thickness of the sacrificial protective material layer 130L can be greater than 5 nm to minimize pinholes within the sacrificial protective material layer 130L.

Figure 5D:
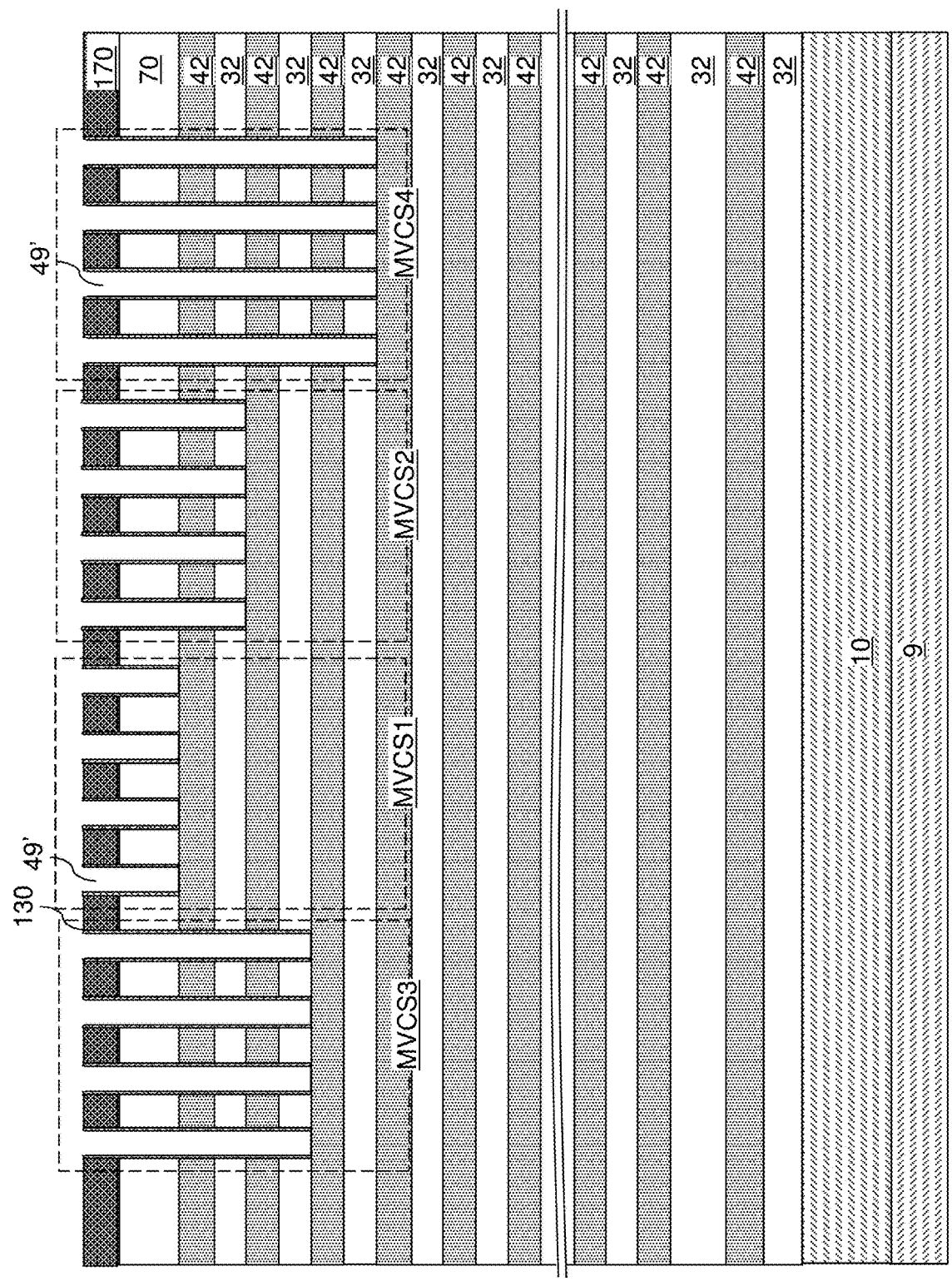

Referring to FIG. 5D, an anisotropic etch process (e.g., sidewall spacer etch) is performed to anisotropically etch horizontal portions of the sacrificial protective material layer 130L. The horizontal portion of the sacrificial protective material layer 130L overlying the hard mask layer 170 and horizontal portions of the sacrificial protective material layer 130L at the bottom of the memory via cavities 49' are removed by the anisotropic etch. Each remaining tubular portion of the sacrificial protective material layer 130L located at a periphery of each memory via cavity 49' constitutes a sacrificial protective liner (e.g., protective sidewall spacer) 130. The sacrificial protective liners 130 are formed around each of the memory via cavities 49'. Sacrificial protective liners 130 located within different subsets (MVCS1-MVCS4) of the memory via cavities 49' have different heights. Sacrificial protective liners 130 located within a same subset (MVCS1-MVCS4) of the memory via cavities 49' have a same height.

Figure 5E:
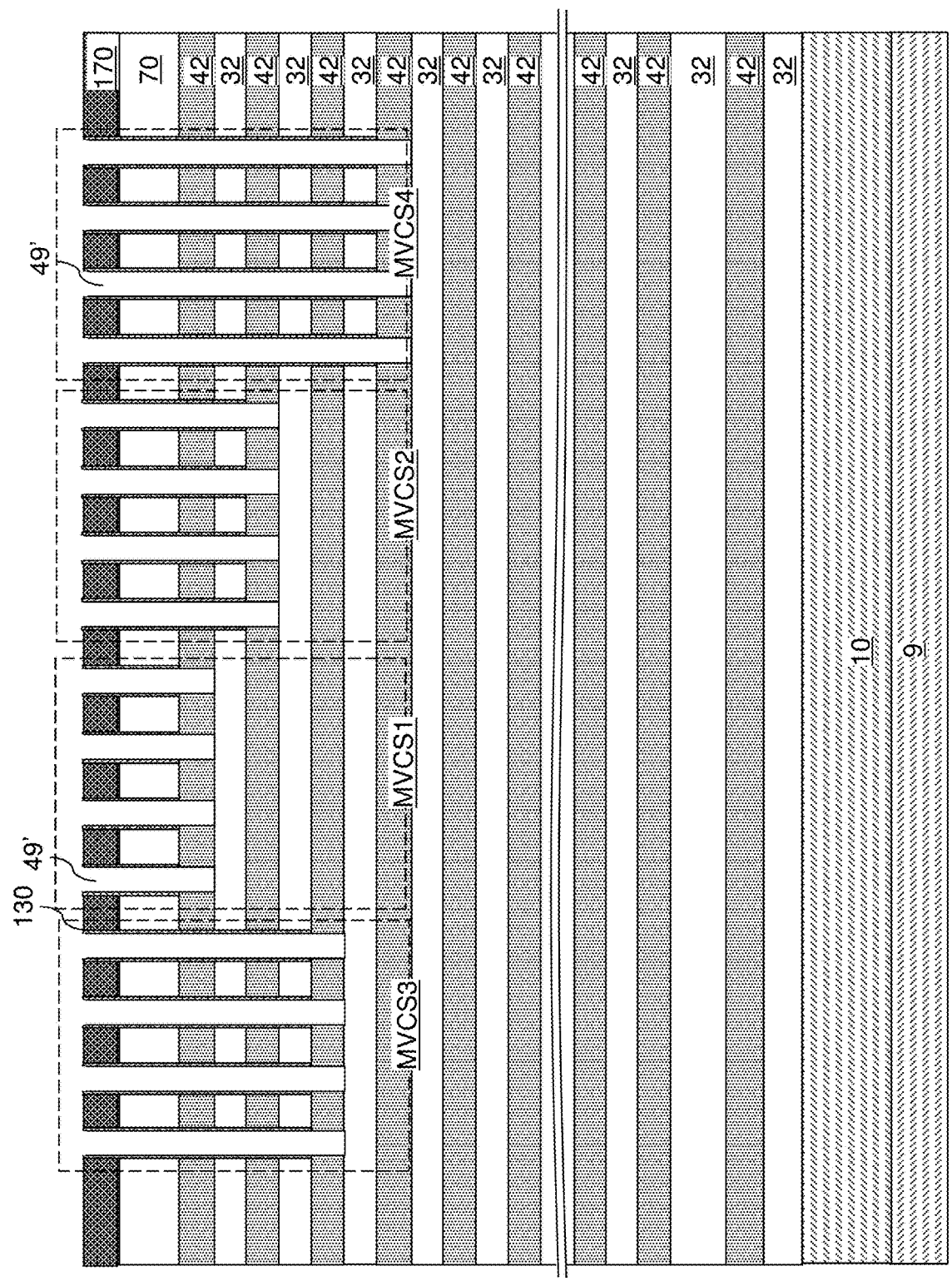

Referring to FIG. 5E, the memory via cavities 49' can be vertically extended through a respective immediately underlying sacrificial material layer 42 by an anisotropic etch process. The anisotropic etch process can employ an etch chemistry that etches the material of the sacrificial material layers 42 selective to the material of the sacrificial protective liners 130 and the hard mask layer 170. For example, if the sacrificial protective liners 130 and the hard mask layer 170 comprise silicon (e.g., amorphous silicon and polysilicon, respectively), the anisotropic etch process can employ an etch chemistry that etches silicon nitride selective to silicon. Each of the memory via cavities 49' can be vertically extended through a respective sacrificial material layer 42 that directly underlie a respective memory via cavity 49'. A cylindrical sidewall of a sacrificial material layer 42 is physically exposed underneath each sacrificial protective liner 130, which extends from a respective horizontal plane including the top surface of the sacrificial material layer 42 with the physically exposed cylindrical sidewall to the hard mask layer 170.

Figure 5F:
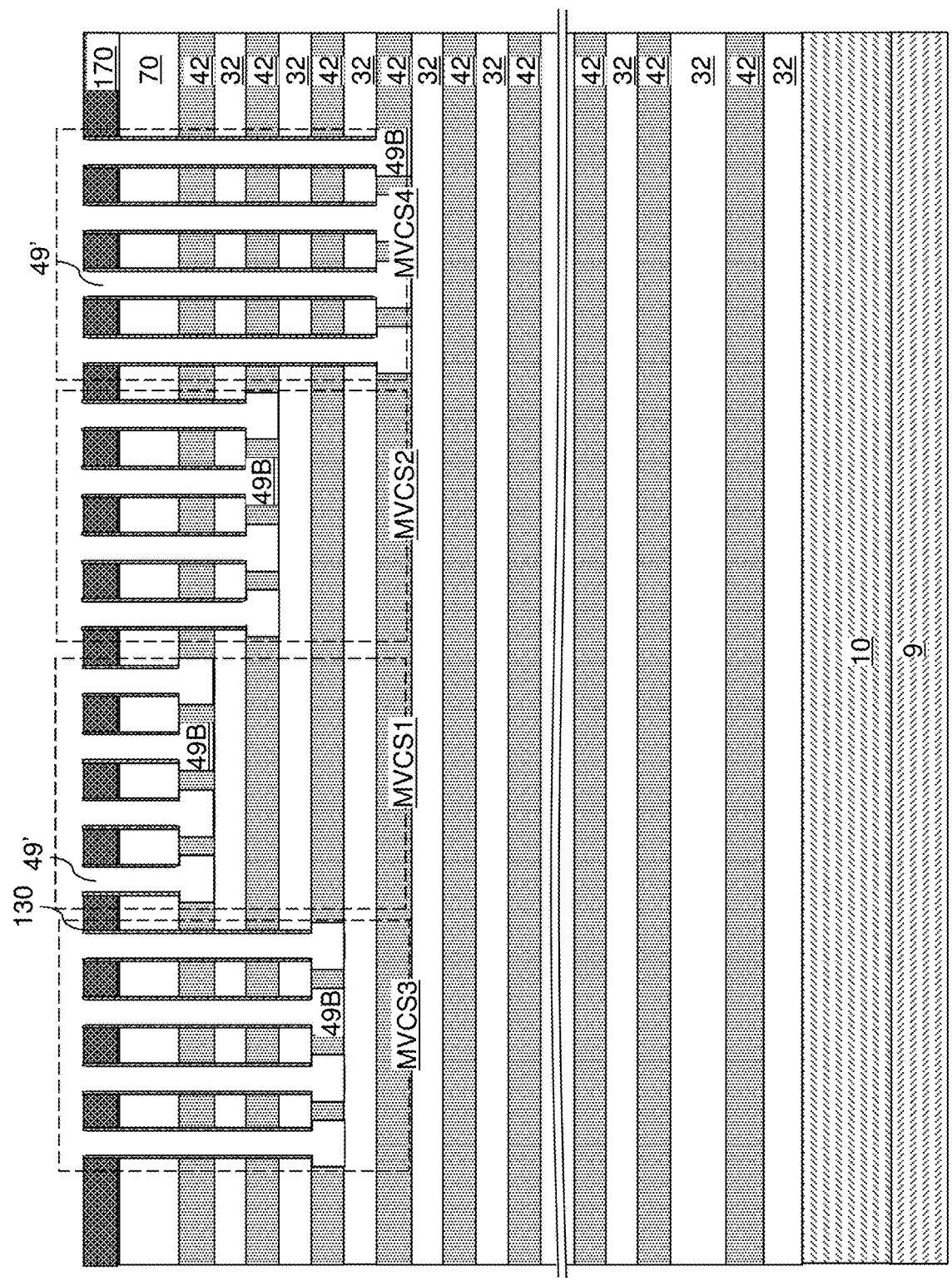

Referring to FIG. 5F, physically exposed sidewalls of the sacrificial material layers 42 are laterally recessed employing an isotropic etch process that etches the material of the sacrificial material layers 42 selective to the material of the sacrificial protective liners 130. If the sacrificial material layers 42 include silicon nitride, the isotropic etch process can include a wet etch process using hot phosphoric acid or a combination of hydrofluoric acid, ammonium fluoride, deionized water, and optionally glycerin or a hot sodium hydroxide solution with optional additives. The physically exposed sidewalls of the sacrificial material layers 42 are laterally recessed during the isotropic etch process by removal of the surface portions of the sacrificial material layers 42 during the isotropic etch process. The lateral etch distance of the isotropic etch process may be in a range from 6 nm to 20 nm, such as from 6.5 nm to 8 nm, although lesser and greater lateral etch distances can also be employed. Each memory via cavity 49' includes a respective bulging region 49B at a bottom portion such that the bulging region has a greater lateral dimension than an overlying region. The distance between nearest neighbor memory openings 49 can be about 25 nm to 50 nm, except at the bulging region 49B, where the distance can be 12 nm to 25 nm.

Referring to FIG. 5G, an anisotropic etch process is performed to etch the materials of the sacrificial material layers 42, the insulating layers 32, and the retro-stepped dielectric material portion 65 selective to the semiconductor material of the semiconductor material layer 10. The anisotropic etch process etches portions of the alternating stack (32, 42) and the retro-stepped dielectric material portion 65 that underlie the memory via cavities 49' and the support via cavities 19' that are not masked by the hard mask layer 170. Memory openings 49 are formed by vertical extension of the memory via cavities 49' to the top surface of the semiconductor material layer 10. Support openings are formed by vertical extension of the support via cavies 19' to the top surface of the semiconductor material layer 10.

The volumes of the memory openings 49 can include volumes of the memory via cavities 49' as provided at the processing steps of FIG. 5E, the laterally bulging regions 49B formed by the isotropic etch process of FIG. 5F, and the volumes of the alternating stack (32, 42) that are removed by the anisotropic etch process of FIG. 5G. The volumes of the laterally bulging regions 49B of the memory openings include the volumes of the sacrificial material layers 42 that are removed by the isotropic etch process of FIG. 5F. Multiple sets of memory openings 49 are formed through the alternating stack (32, 42). Each set of memory openings 49 has laterally bulging region at a level of a respective one of the sacrificial material layers 42, and each of the memory openings 49 has only a single laterally bulging region. Generally, N topmost sacrificial material layers 42 can be employed to provide N different types of memory openings 49 such that each type of memory openings 49 includes respective laterally bulging regions within a respective one of the N topmost sacrificial material layers 42. The number N may be in a range from 2 to 32, such as from 4 to 8.

Figure 5H:
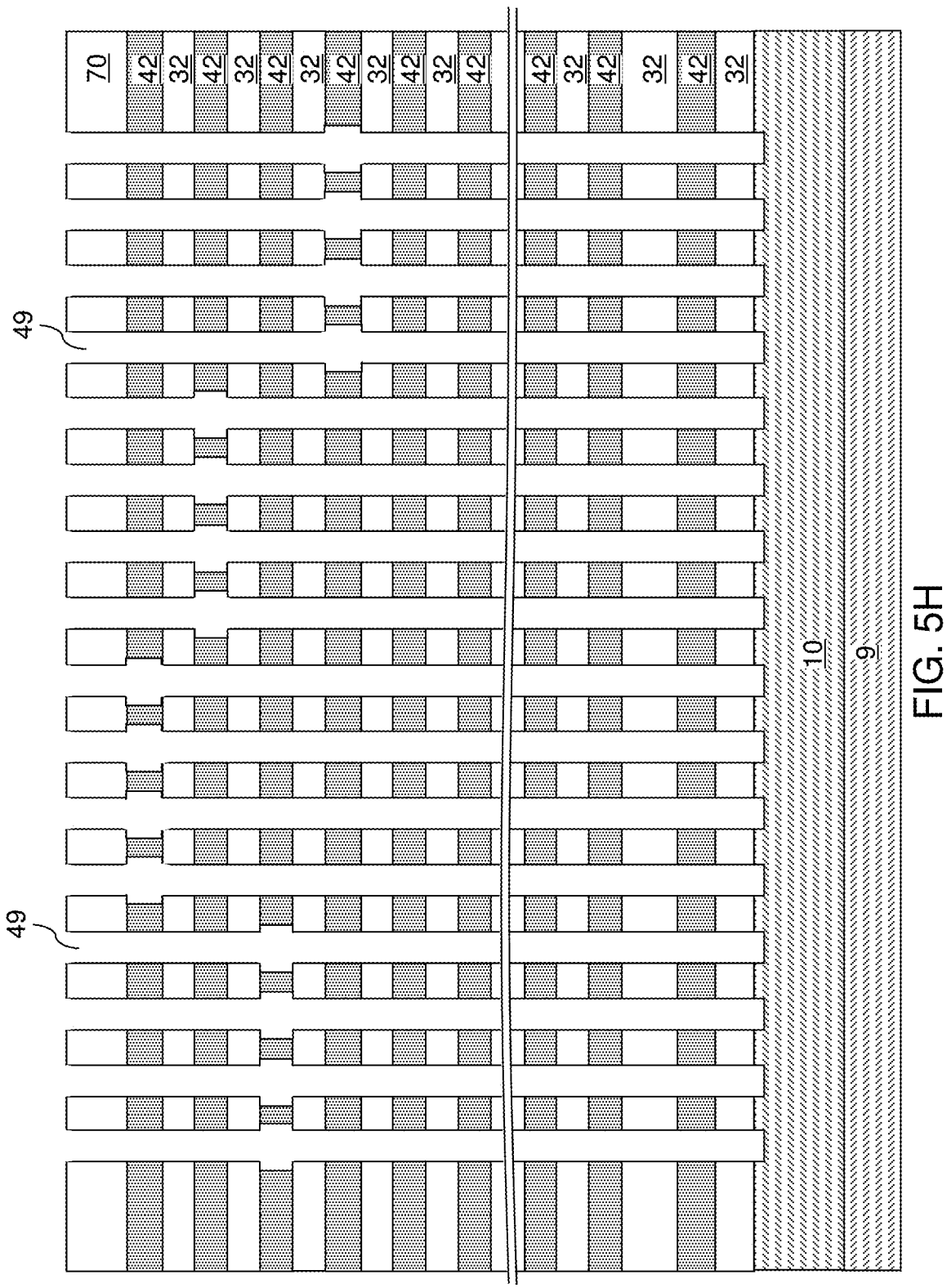

Referring to FIG. 5H, the sacrificial protective liners 130 and any remaining portion of the hard mask layer 170 can be removed. In one embodiment, the hard mask layer 170 may be removed between a first step of an anisotropic etch process that etches a predominant subset of the material layers within the alternating stack (32, 42) excluding one or two bottommost layers of the alternating stack (32, 42) and a second step of the anisotropic etch process that etches the one or two bottommost layers of the alternating stack (32, 42). Alternatively, the hard mask layer 170 may be removed after the anisotropic etch process selective to the materials of the alternating stack (32, 42) and the semiconductor material layer 10.

Figure 6A:
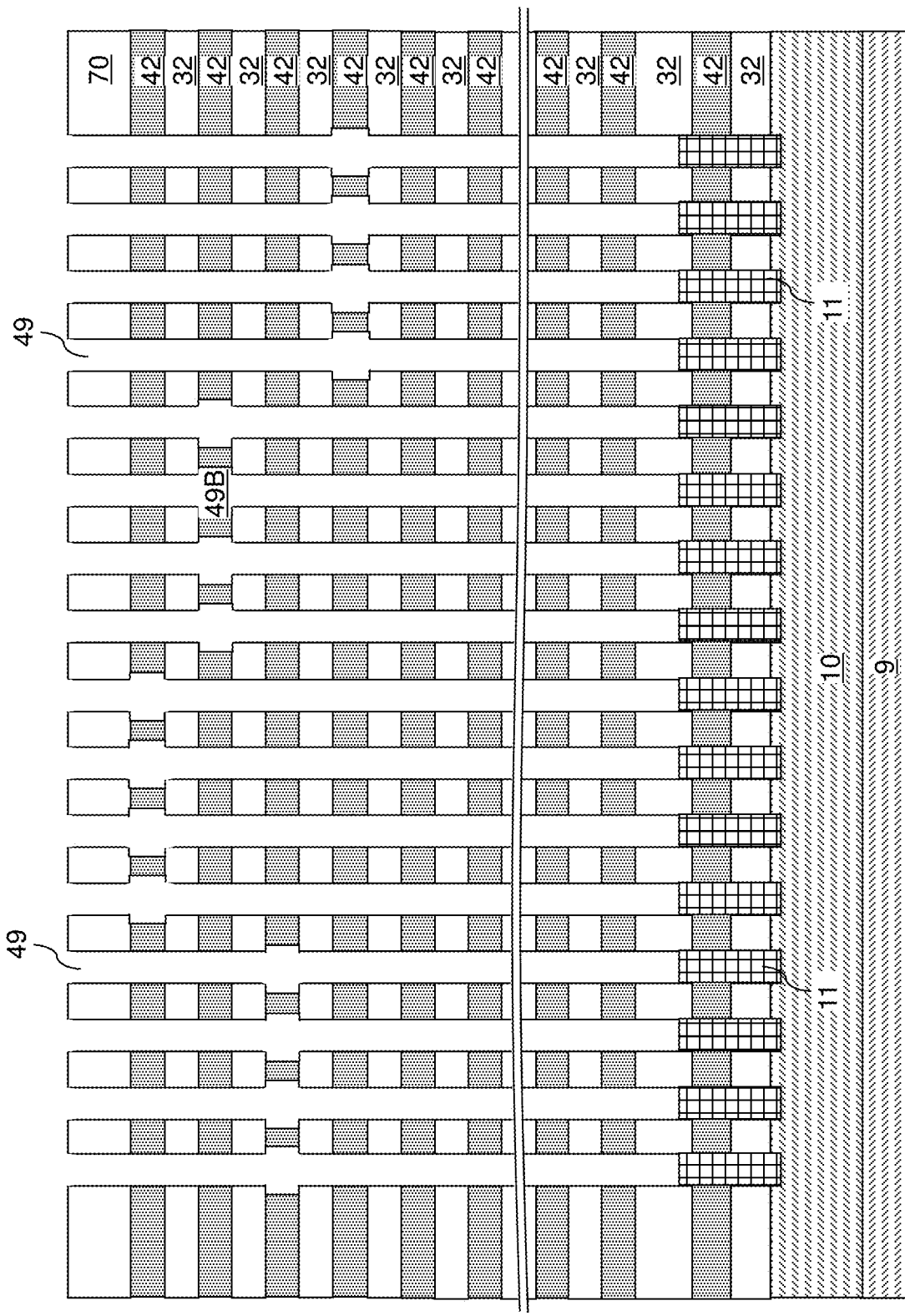
FIG. 6A is a vertical cross-sectional view of the exemplary structure after formation of pedestal channel structures according to an embodiment of the present disclosure.
Figure 6B:
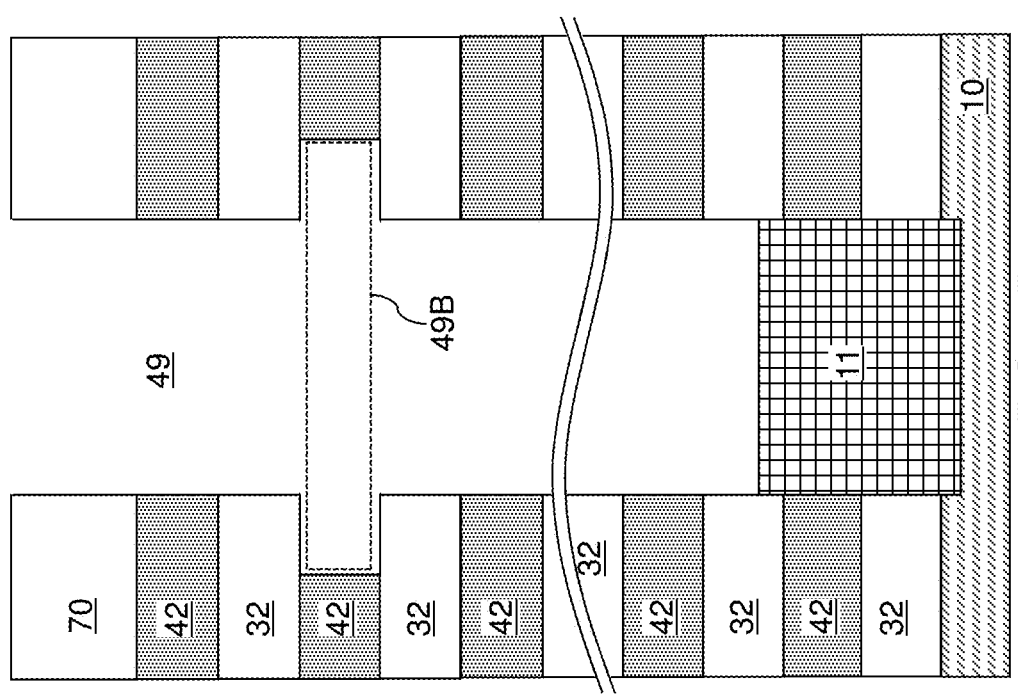
FIG. 6B is a vertical cross-sectional view of a bulged memory opening within the exemplary structure of FIG. 6A.

Referring to FIGS. 6A and 6B, an optional pedestal channel portion 11 can be formed at the bottom portion of each memory opening 49 and each support openings, for example, by a selective semiconductor material deposition process. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a bottommost sacrificial material layer 42. In this case, at least one source select gate electrode can be subsequently formed by replacing the bottommost sacrificial material layer 42 with a conductive material layer. The pedestal channel portion 11 can be a portion of a transistor channel that extends between a source region to be subsequently formed in the substrate (9, 10) and a drain region to be subsequently formed in an upper portion of each memory opening 49. A memory cavity is present in the unfilled portion of the memory opening 49 above the pedestal channel portion 11. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figure 7A:
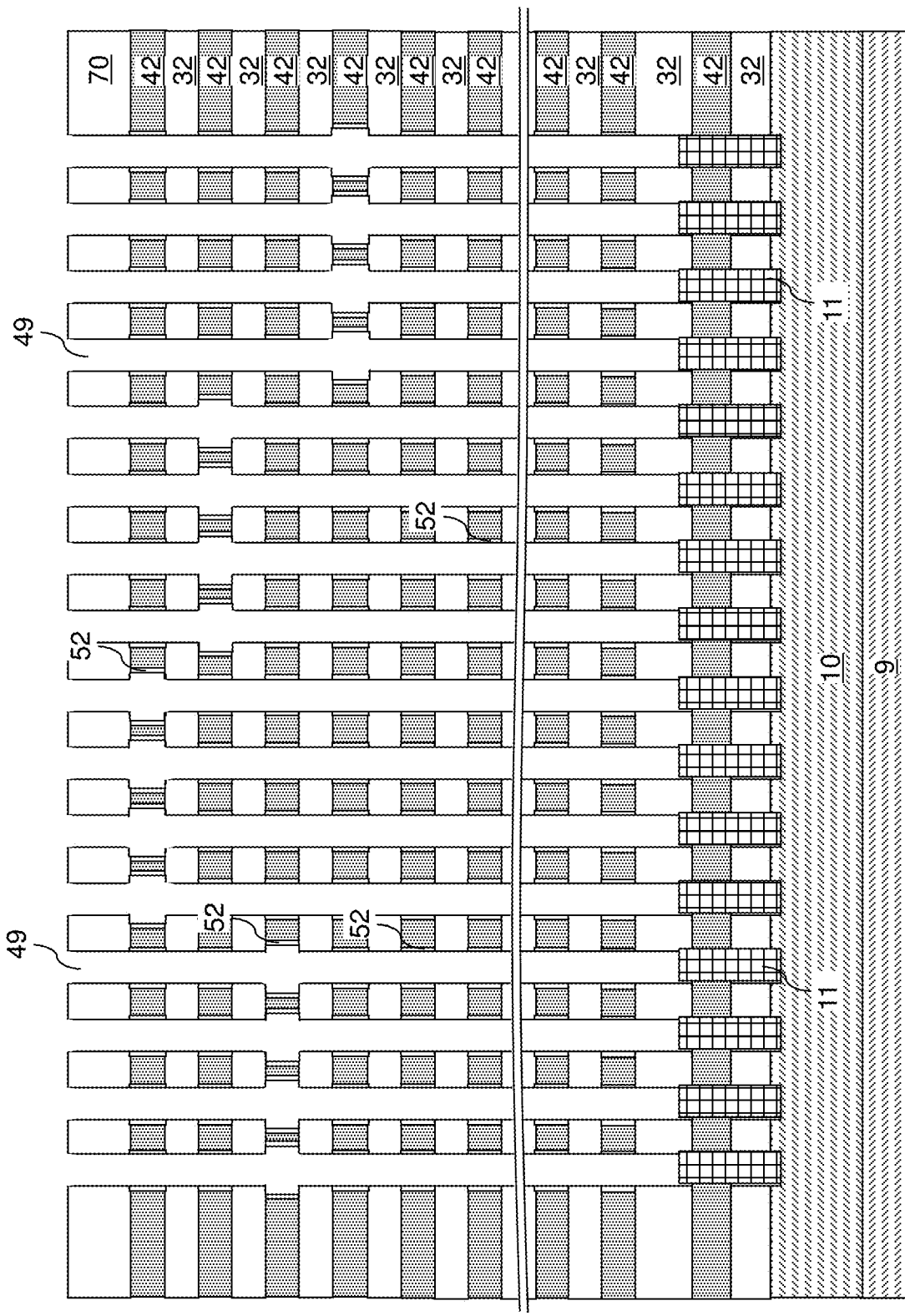
FIG. 7A is a vertical cross-sectional view of the exemplary structure after formation of tubular blocking dielectrics around the bulged memory openings according to an embodiment of the present disclosure.
Figure 7B:
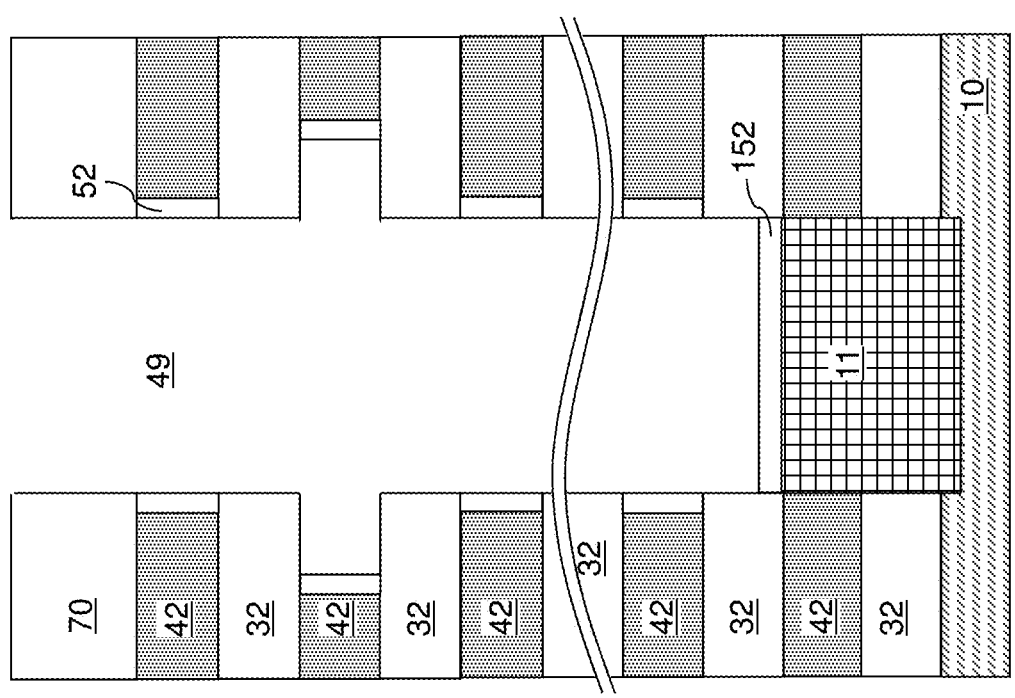
FIG. 7B is a vertical cross-sectional view of a bulged memory opening within the exemplary structure of FIG. 7A.

Referring to FIGS. 7A and 7B, an oxidation process is performed to convert surface portions of the sacrificial material layers 42 into tubular blocking dielectrics 52. For example, if the sacrificial material layers 42 include silicon nitride or a silicon-containing semiconductor material, a thermal oxidation process can be performed to convert surface portions of the sacrificial material layers 42 into tubular semiconductor oxide material portions, which are the tubular blocking dielectrics 52. A semiconductor oxide plate 152 can be formed by oxidation of a top surface of portion of a pedestal channel portion 11 within each memory opening 49. The thickness of each tubular blocking dielectric 52, as measured between an inner sidewall and an outer sidewall, can be in a range from 1 nm to 12 nm, such as from 2 nm to 6 nm, although lesser and greater thicknesses can also be employed. In case the sacrificial material layers 42 include silicon nitride, each tubular blocking dielectric 52 can include a silicon oxide material with nitrogen doping such that the nitrogen concentration decreases with a distance from the interface with the sacrificial material layer 42.

Figure 8A:
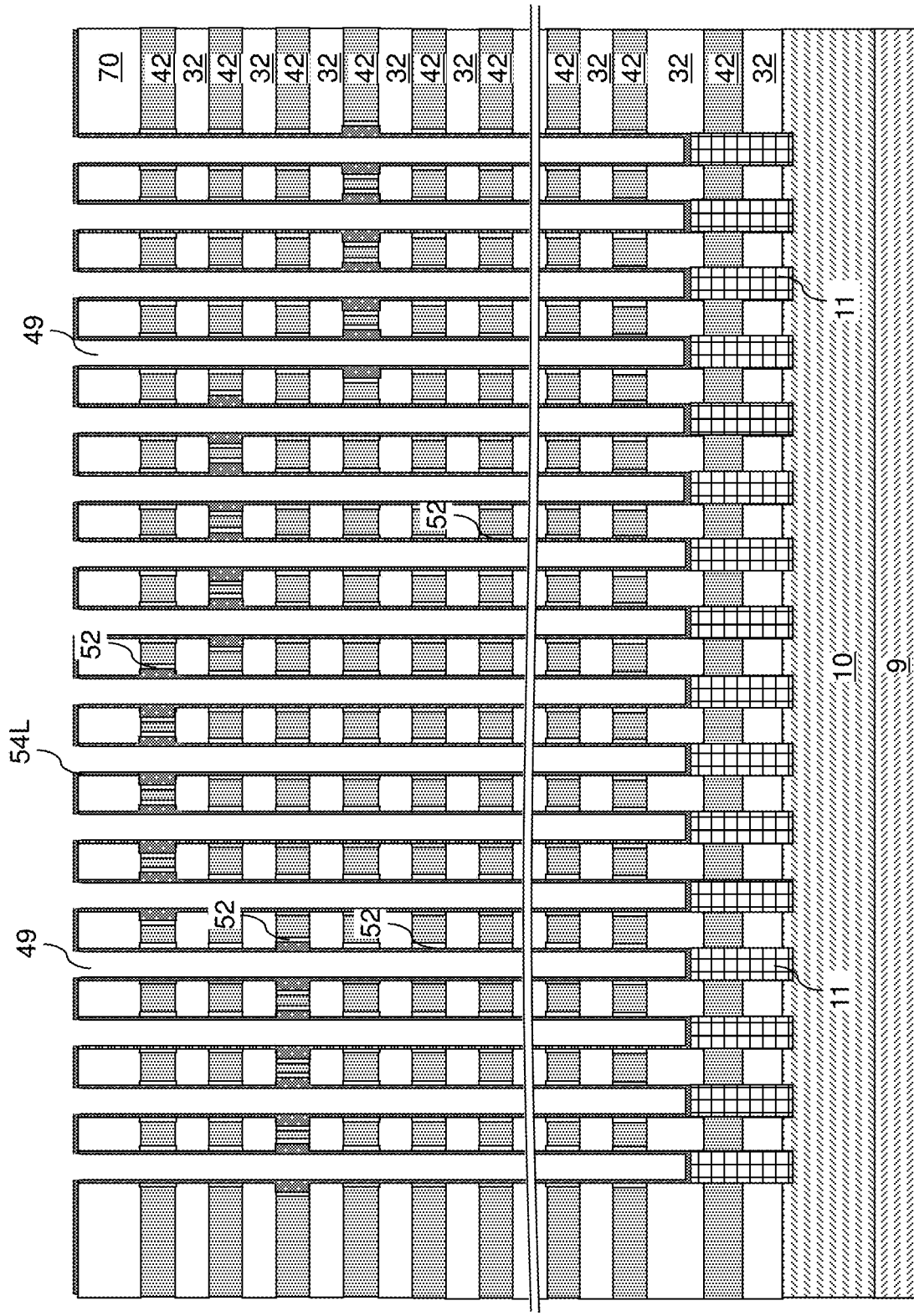
FIG. 8A is a vertical cross-sectional view of the exemplary structure after formation of a continuous charge storage material layer including bulging portions according to an embodiment of the present disclosure.
Figure 8B:
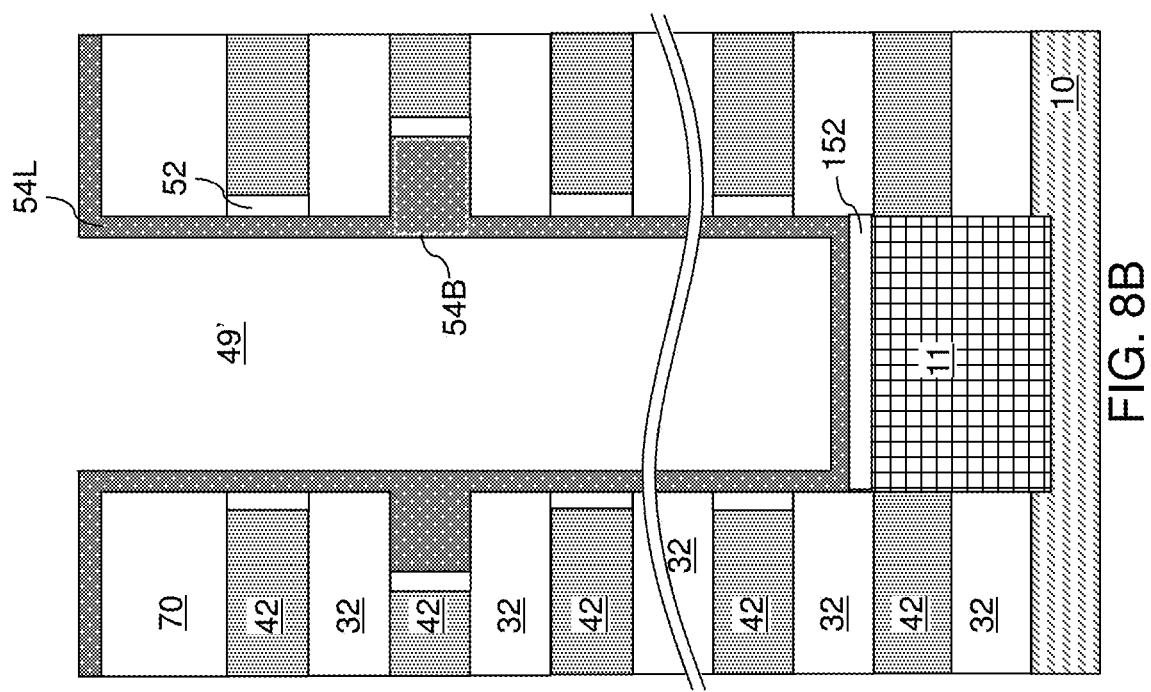
FIG. 8B is a vertical cross-sectional view of a bulged memory opening within the exemplary structure of FIG. 8A.

Referring to FIGS. 8A and 8B, a continuous charge storage material layer 54L can be deposited in the memory openings 49 by a conformal deposition process. The thickness of the continuous charge storage layer 54L is greater than one half of the thickness of the sacrificial material layers 42 so that the continuous charge storage material layer 54L fills volumes of the laterally bulging regions 49B of the memory openings 49. In one embodiment, the continuous charge storage material layer 54L includes a dielectric charge trapping material, which can be, for example, silicon nitride. The thickness of the continuous charge storage material layer 54L as deposited can be in a range from 10 nm to 40 nm, such as from 15 nm to 30 nm, although lesser and greater thicknesses can also be employed.

Optionally, portions of the continuous storage material layer 54L can be etched back to a target thickness by performing an etch back process. The etch back process can include an isotropic etch process such as a wet etch process. The vertical portions of the continuous charge storage material layer 54L located at levels other than the level of a respective bulging region in each memory opening 49 can have the target thickness, which can be in a range from 2 nm to 20 nm, such as from 4 nm to 8 nm, although lesser and greater thicknesses can also be employed. In an illustrative example, if the continuous charge storage material layer 54L includes silicon nitride, the isotropic etch process can include a wet etch process employing a combination of hydrofluoric acid, ammonium fluoride, deionized water, and optionally glycerin or a hot sodium hydroxide solution with optional additives. Remaining portions of the continuous charge storage material layer 54L fill volumes of the laterally bulging regions of the memory openings 49.

The bulging portions 54B of the continuous charge storage material layer 54L that fill the laterally bulging regions 49B of the memory openings 49 has a greater lateral thickness than the target thickness of the other remaining vertical portions of the continuous charge storage material layer 54L. The difference between the lateral thickness of the bulging portions 54B of the continuous charge storage layer 54L and the thickness of the portions of the continuous charge storage layer 54L located at other levels can be the same (e.g., 6 nm to 20 nm, such as 6.5 nm to 8 nm) as the lateral recess distance at the processing steps of FIG. 5F.

In one embodiment, each unfilled volume of the memory openings 49 after the etch back process can be laterally surrounded by a straight sidewall of the remaining portions of the continuous charge storage material layer 54L that vertically extends at least from a bottommost one of the spacer material layers (such as the bottommost sacrificial material layer 42) to a topmost one of the spacer material layers (such as the topmost sacrificial material layer 42).

Figure 9A:
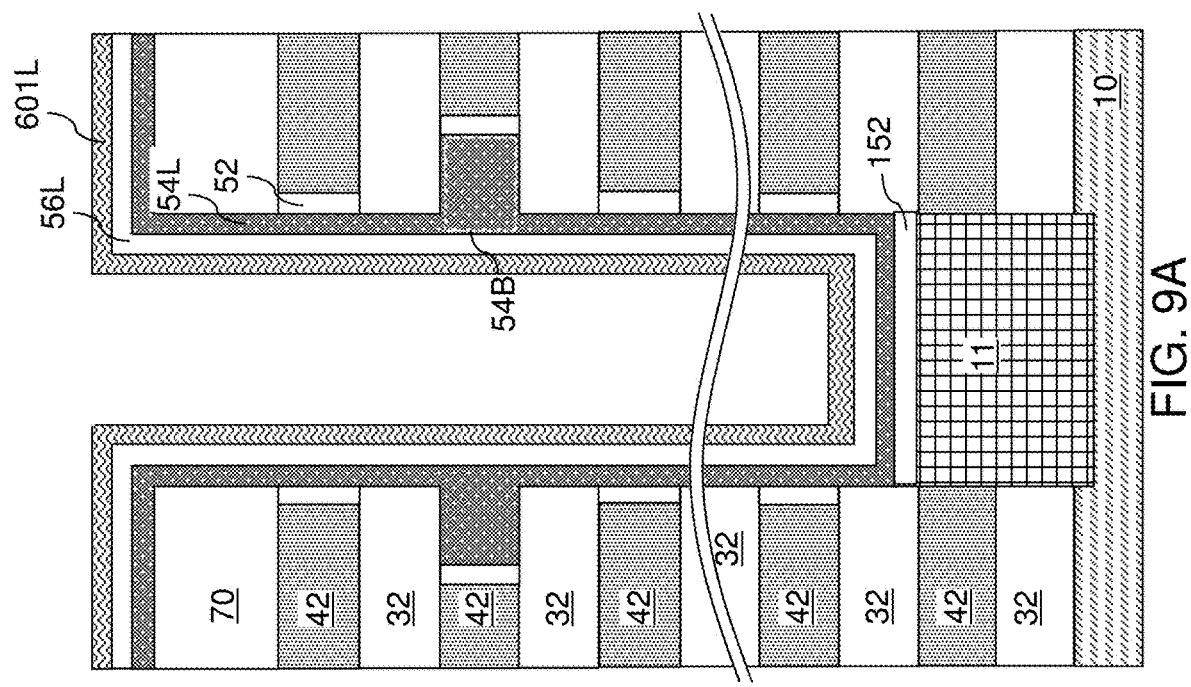
FIGS. 9A-9E are sequential vertical cross-sectional views of a bulged memory opening during formation of a memory opening fill structure therein according to an embodiment of the present disclosure.

Referring to FIG. 9A, a continuous tunneling dielectric layer 56L and a first continuous semiconductor channel material layer 601L can be sequentially deposited on the continuous charge storage material layer 54L. The continuous tunneling dielectric layer 56L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The continuous tunneling dielectric layer 56L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the continuous tunneling dielectric layer 56L can include a stack of a first silicon oxide layer, a silicon oxynitride layer, and a second silicon oxide layer, which is commonly known as an ONO stack. In one embodiment, the continuous tunneling dielectric layer 56L can include a silicon oxide layer that is substantially free of carbon or a silicon oxynitride layer that is substantially free of carbon. The thickness of the continuous tunneling dielectric layer 56L can be in a range from 2 nm to 20 nm, although lesser and greater thicknesses can also be employed.

The first continuous semiconductor channel material layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first continuous semiconductor channel material layer 601L includes amorphous silicon or polysilicon. The first continuous semiconductor channel material layer 601L can be formed by a conformal deposition method such as low pressure chemical vapor deposition (LPCVD). The thickness of the first continuous semiconductor channel material layer 601L can be in a range from 2 nm to 10 nm, although lesser and greater thicknesses can also be employed. A memory cavity is formed in the volume of each memory opening 49 that is not filled with the deposited material layers (52L, 54L, 56L, 601L).

Figure 9B:
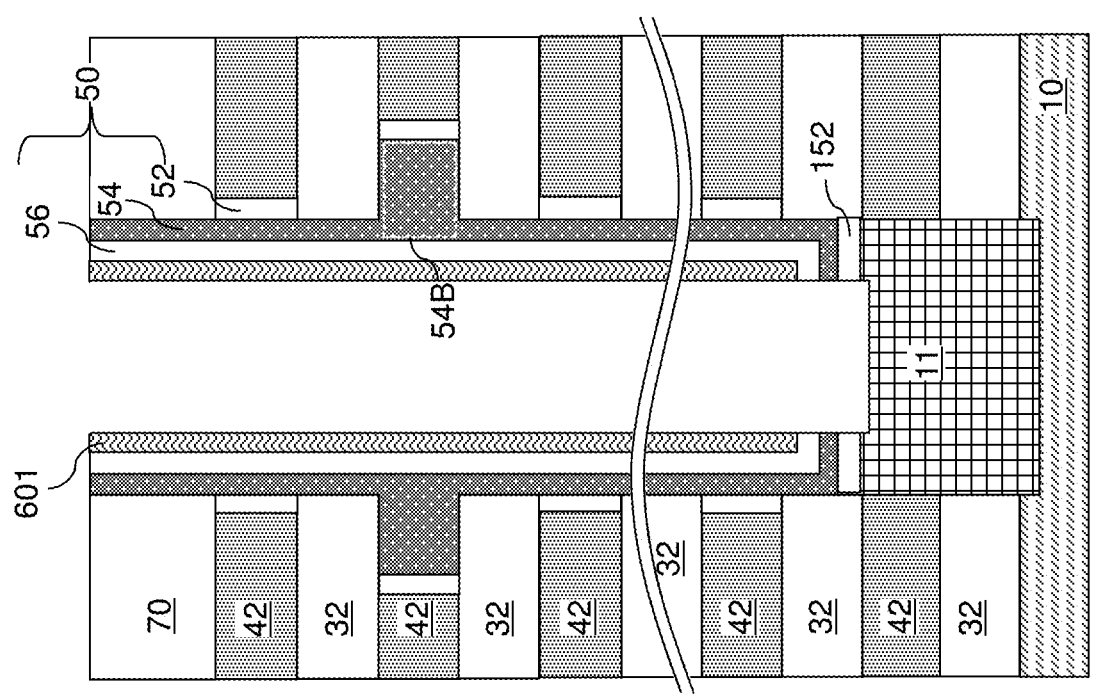

Referring to FIG. 9B, horizontal portions of the first continuous semiconductor channel material layer 601L, the continuous tunneling dielectric layer 56L, and the continuous charge storage material layer 54L can be removed by at least one anisotropic etch process. The portions of the first continuous semiconductor channel material layer 601L, the continuous tunneling dielectric layer 56L, and the continuous charge storage material layer 54L located above the top surface of the insulating cap layer 70 can be removed by the at least one anisotropic etch process. Further, the horizontal portions of the first continuous semiconductor channel material layer 601L, the continuous tunneling dielectric layer 56L, and the continuous charge storage material layer 54L located at a bottom of each memory cavity can be removed to form openings in remaining portions thereof. A center portion of each semiconductor oxide plate 152 can be etched through by the at least one anisotropic etch process. Each of the first continuous semiconductor channel material layer 601L, the continuous tunneling dielectric layer 56L, the continuous charge storage material layer 54L, and the semiconductor oxide plates 152 can be etched by a respective anisotropic etch process employing a respective etch chemistry, which may, or may not, be the same for the various material layers.

Each remaining discrete portion of the first continuous semiconductor channel material layer 601L constitutes a first semiconductor channel layer 601 having a tubular configuration. Each remaining portion of the continuous tunneling dielectric layer 56L constitutes a tunneling dielectric 56 having a tubular configuration. Each remaining portion of the continuous charge storage material layer 54L constitutes a charge storage layer 54 including a charge trapping material or a floating gate material.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity can be vertically recessed so that the recessed semiconductor surface underneath the memory cavity is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of all tubular blocking dielectrics 52, a charge storage layer 54, and a tunneling dielectric layer 56 in a memory opening 49 constitutes a memory film 50. In one embodiment, the semiconductor oxide plate 152, the first semiconductor channel layer 601, the tunneling dielectric layer 56, and the charge storage layer 54 within a memory opening 49 can have vertically coincident sidewalls. As used herein, a first surface and a second surface are vertically coincident if the second surface overlies or underlies the first surface and if there exists a vertical plane including the first surface and the second surface.

Thus, a memory film 50 is formed within each of the memory openings 49. Each charge storage layer 54 includes a respective laterally bulging portion 54B located within a respective one of the laterally bulging regions of the memory openings 49. Thus, each memory film 50 has a respective laterally bulging portion located within a respective one of the laterally bulging regions of the memory openings 49. Each of the memory films 50 can be formed with a respective straight inner sidewall that extends at least from a bottommost one of the sacrificial material layers 42 to a topmost one of the sacrificial material layers 42.

Figure 9C:
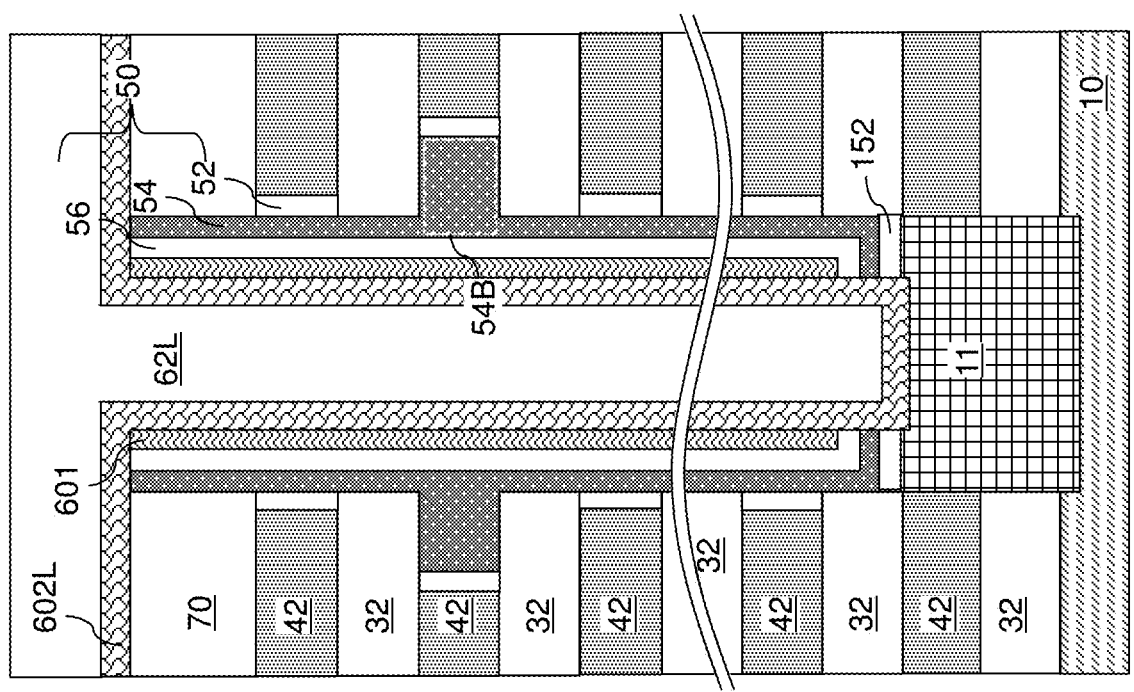

Referring to FIG. 9C, a second continuous semiconductor channel material layer 602L can be deposited directly on the semiconductor surface of each pedestal channel portion 11 (or physically exposed portions of the semiconductor material layer 10 if the pedestal channel portion 11 is omitted), and directly on each first semiconductor channel layer 601. The second continuous semiconductor channel material layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second continuous semiconductor channel material layer 602L includes amorphous silicon or polysilicon. The second continuous semiconductor channel material layer 602L can be formed by a conformal deposition method such as low pressure chemical vapor deposition (LPCVD). The thickness of the second continuous semiconductor channel material layer 602L can be in a range from 2 nm to 10 nm, although lesser and greater thicknesses can also be employed. The second continuous semiconductor channel material layer 602L may partially fill the memory cavity in each memory opening, 49 or may fully fill the cavity in each memory opening 49.

The materials of the first semiconductor channel layers 601 and the second continuous semiconductor channel material layer 602L are collectively referred to as a semiconductor channel material. In other words, the semiconductor channel material is a set of all semiconductor material in the first semiconductor channel layers 601 and the second continuous semiconductor channel material layer 602L.

In case the memory cavity in each memory opening 49 is not completely filled by the second continuous semiconductor channel material layer 602L, a dielectric core layer 62L can be deposited in the memory cavities to fill any unfilled volumes of the memory openings 49. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 9D:
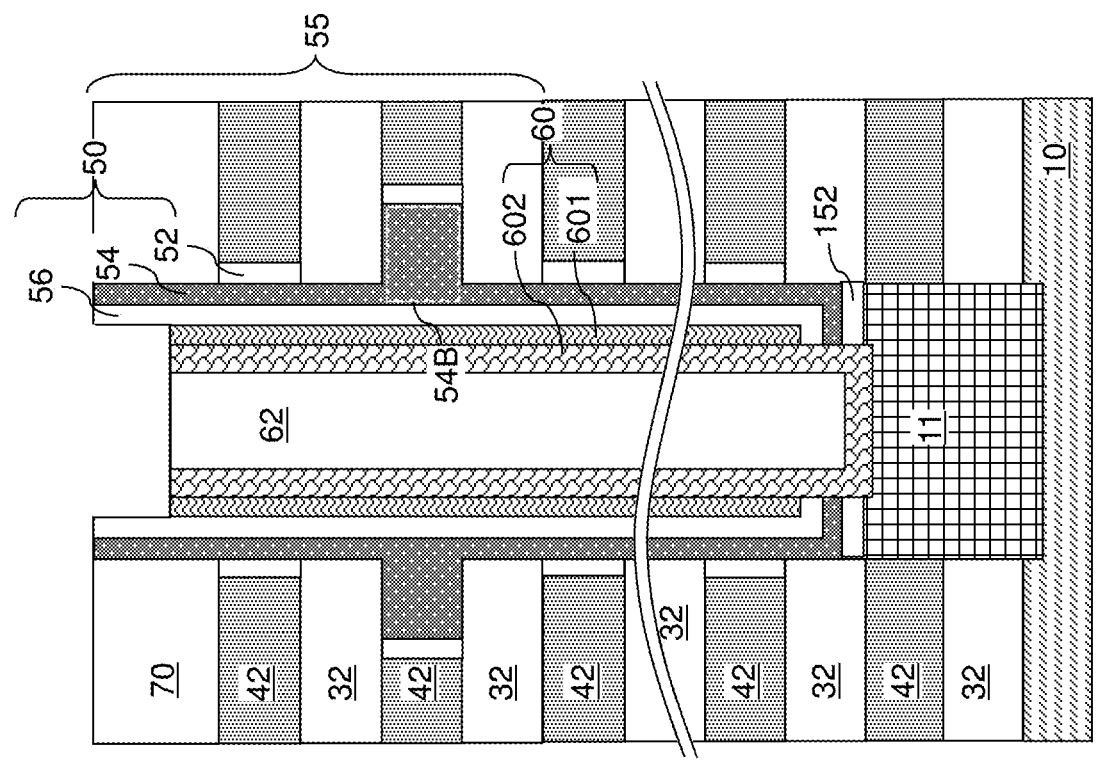
Figure 9E:
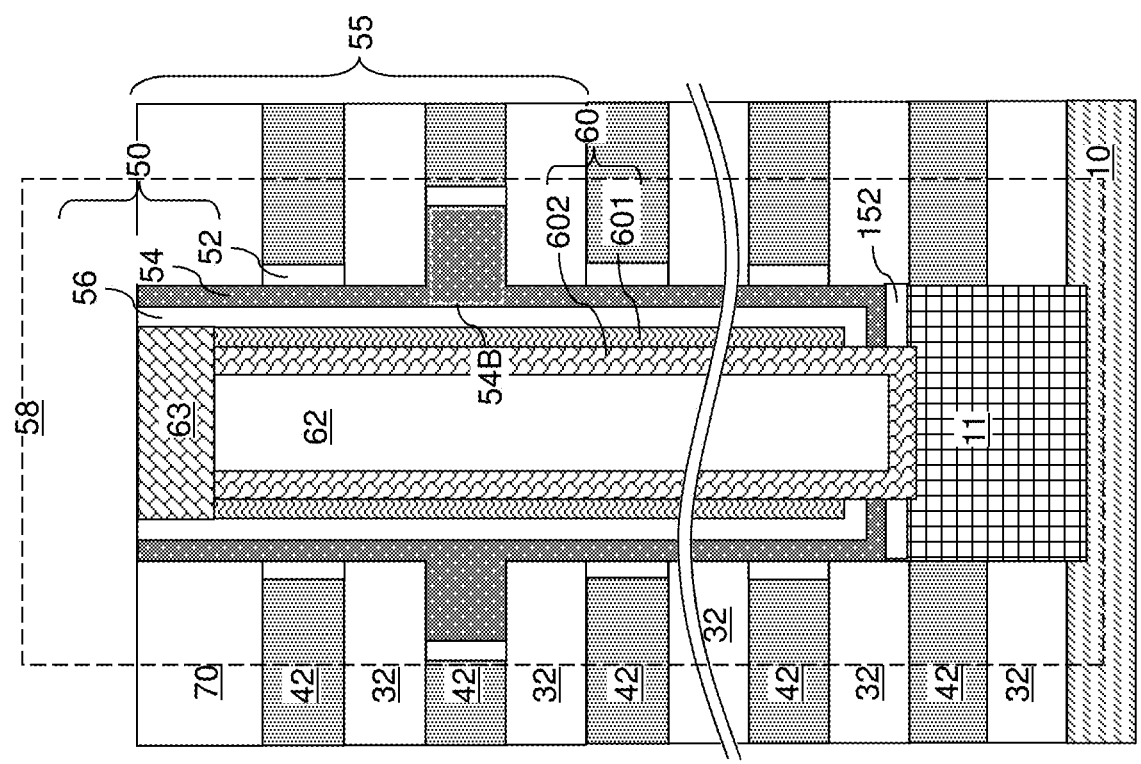
Figure 10A:
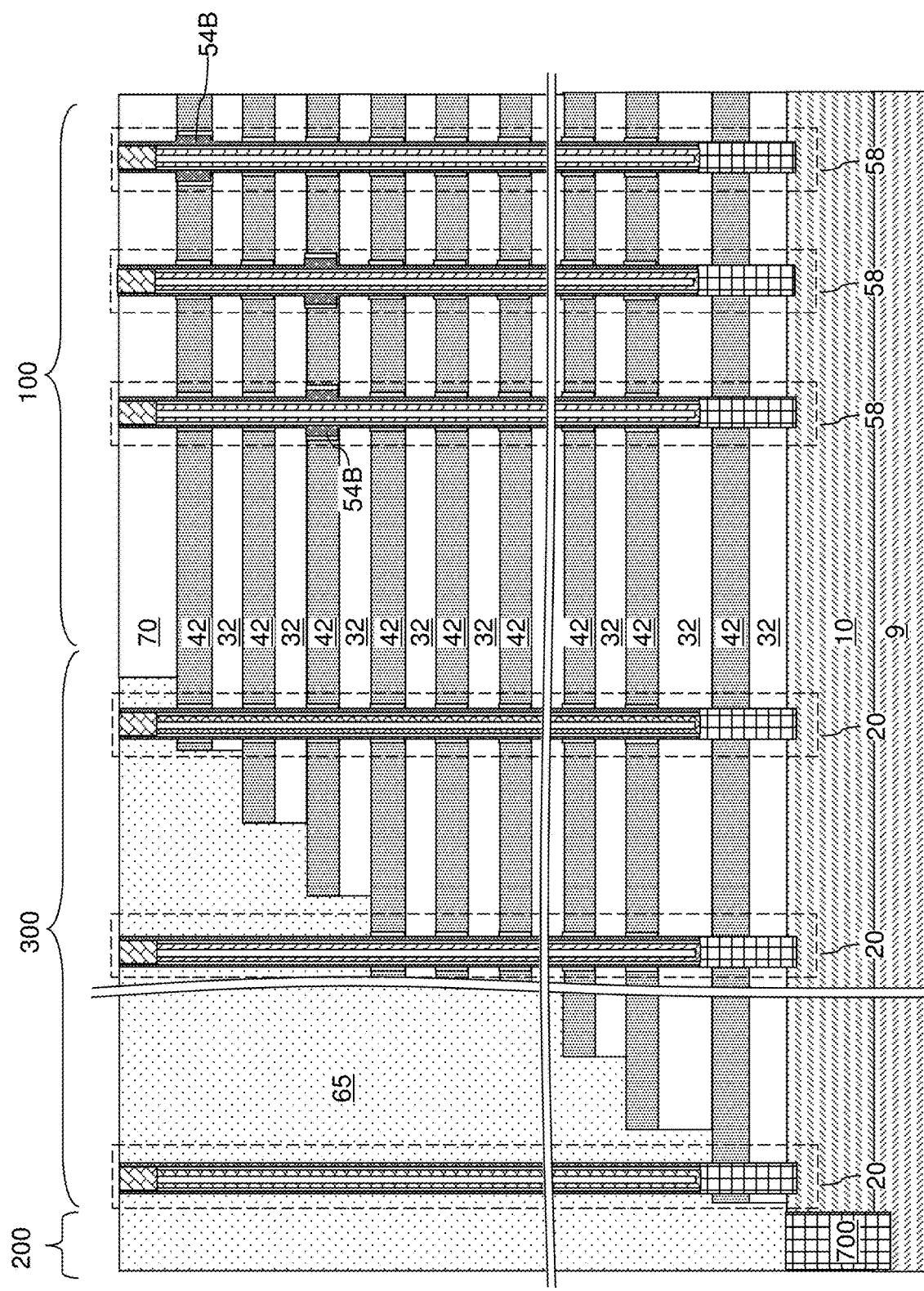
FIG. 10A is a vertical cross-sectional view of the exemplary structure after formation of the memory opening fill structures according to an embodiment of the present disclosure.
Figure 10B:
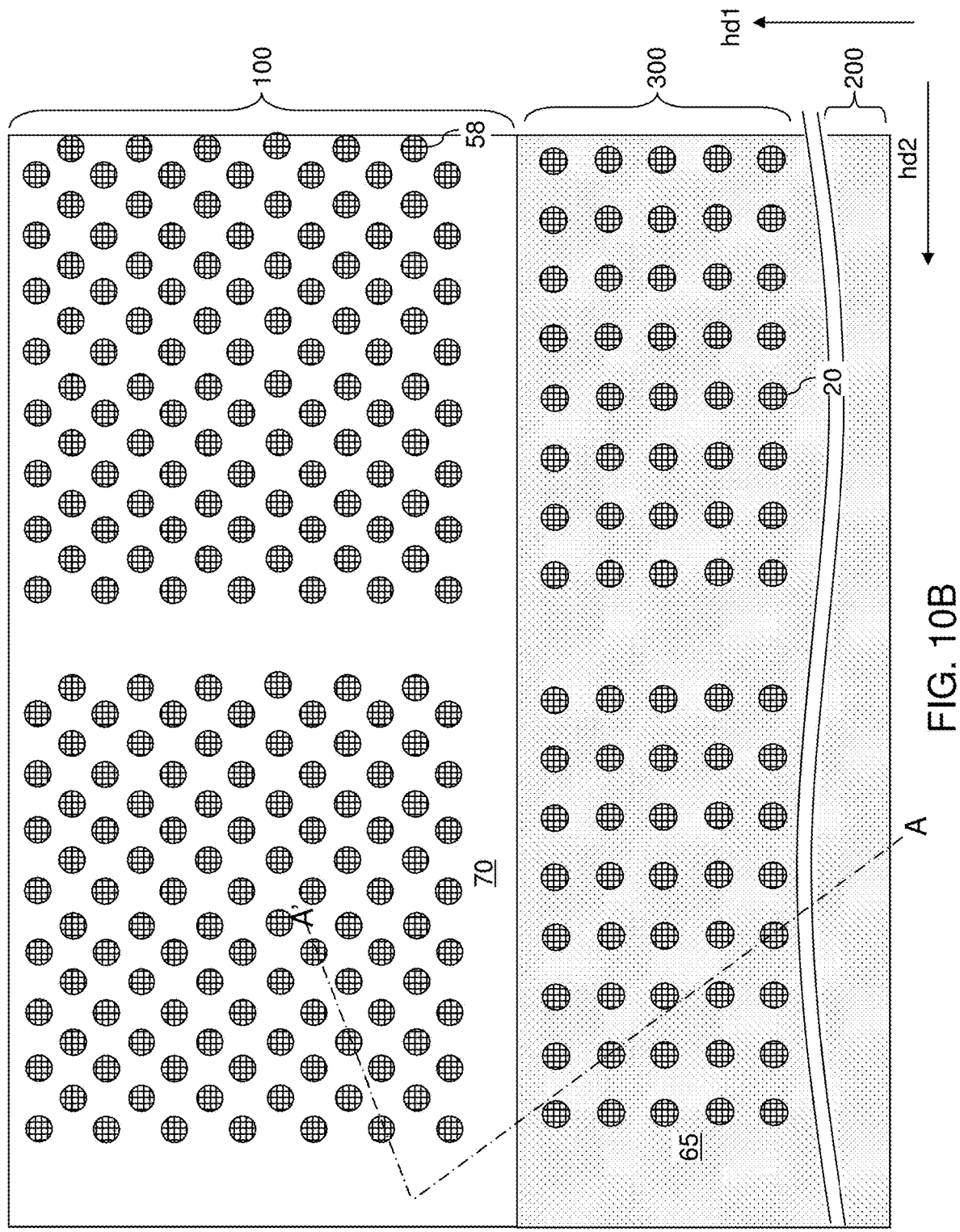
FIG. 10B is a vertical cross-sectional view of the exemplary structure along the hinged vertical plane B-B' of FIG. 10A. The horizontal plane B-B' is the plane of the horizontal cross-sectional view of FIG. 10A.
Figure 10C:
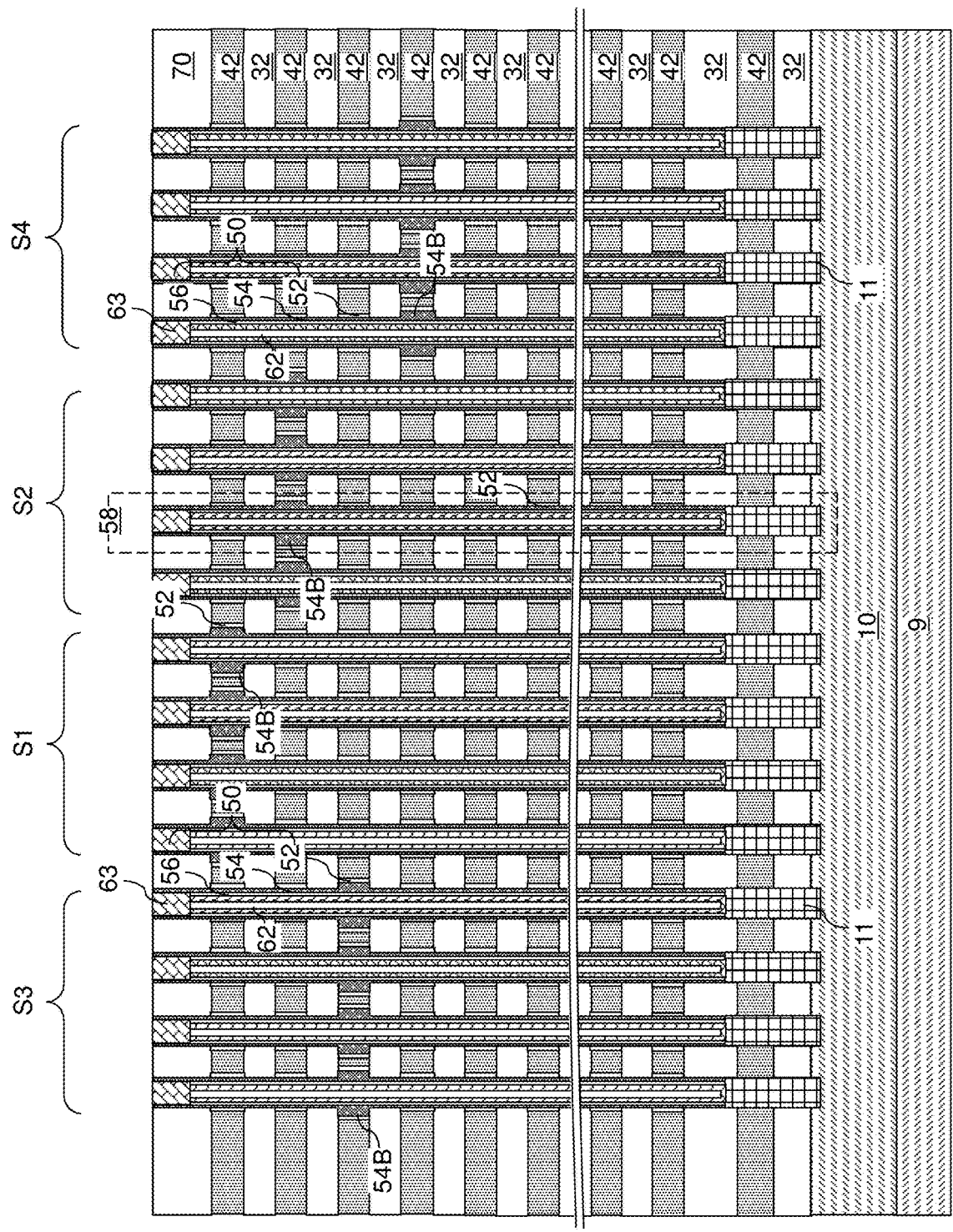
FIG. 10C is a vertical cross-sectional view of the exemplary structure of FIGS. 10A and 10B along the hinged vertical plane C-C' of FIG. 10B.

Referring to FIG. 9D, the horizontal portions of the dielectric core layer 62L and the second continuous semiconductor channel material layer 602L overlying the insulating cap layer 70 can be removed, for example, by a recess etch. The recess etch can be continued to recess the dielectric core layer 62L below the top surface of the insulating cap layer 70 such that top surfaces of the remaining portions of the dielectric core layer 62L is located between the horizontal plane including the top surface of the insulating cap layer 70 and the horizontal plane including the bottom surface of the insulating cap layer 70. The first semiconductor channel layers 601 and remaining portions of the second continuous semiconductor channel material layer 602L may be recessed below the horizontal plane including the top surface of the dielectric cap layer 70. The second continuous semiconductor channel material layer 602L is divided into multiple discrete portions located within a respective one of the memory openings 49. Each discrete portion of the second continuous semiconductor channel material layer 602L is herein referred to as a second semiconductor channel layer 602.

Each remaining portion of the dielectric core layer 62L constitutes a dielectric core 62. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. Each contiguous set of tubular blocking dielectrics 52, a charge storage layer 54, and a tunneling dielectric layer 56 collectively constitute a memory film 50, which can store electrical charges with a macroscopic retention time. As used herein, a macroscopic retention time refers to a retention time suitable for operation of a memory device as a permanent memory device such as a retention time in excess of 24 hours. Each combination of a memory film 50 and a vertical semiconductor channel 60 within a memory opening 49 constitutes a memory stack structure 55.

Referring to FIGS. 9E and 10A-10C, drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a pedestal channel portion 11 (if present), a semiconductor oxide plate 152, a memory stack structure 55, a dielectric core 62, and a drain region 63 within a memory opening 49 is herein referred to as a memory opening fill structure 58. Each combination of a pedestal channel portion 11 (if present), a semiconductor oxide portion 152, a memory film 50, a vertical semiconductor channel 60, a dielectric core 62, and a drain region 63 within each support opening 19 fills the respective support openings 19, and constitutes a support pillar structure 20.

The memory stack structures 55 include multiple types of memory stack structures 55 including a laterally bulging portion 54B at different levels. For example, the memory stack structures 55 can include a first subset S1 of the memory stack structures 55 including a respective first memory film 50 having a laterally bulging portion at a level of a topmost one of the sacrificial material layers 42, a second subset S2 of the memory stack structures 55 including a respective second memory film 50 having a laterally bulging portion at a level of a second-from-top one of the sacrificial material layers 42, a third subset S3 of the memory stack structures 55 including a respective first memory film 50 having a laterally bulging portion at a level of a third-from-the-top one of the sacrificial material layers 42, and a fourth subset S4 of the memory stack structures 55 including a respective second memory film 50 having a laterally bulging portion at a level of a fourth-from-top one of the sacrificial material layers 42. In one embodiment, each subset of memory stack structures 55 may comprise a memory string. Generally, N subsets (e.g., strings) of memory stack structures 55 including a respective memory film 50 having a laterally bulging portion 54B at N different topmost levels of the sacrificial material layers 42 can be formed. The bulging portions provide a greater thickness for the charge storage layer 54. Thus, each portion of the vertical semiconductor channels 60 that is laterally surrounded by any of the laterally bulging portions of the memory films 50 has a higher threshold voltage than any portion of the vertical semiconductor channels 60 that is laterally surrounded by a portion of the first or second memory films that is not a laterally bulging portion.

Figure 11A:
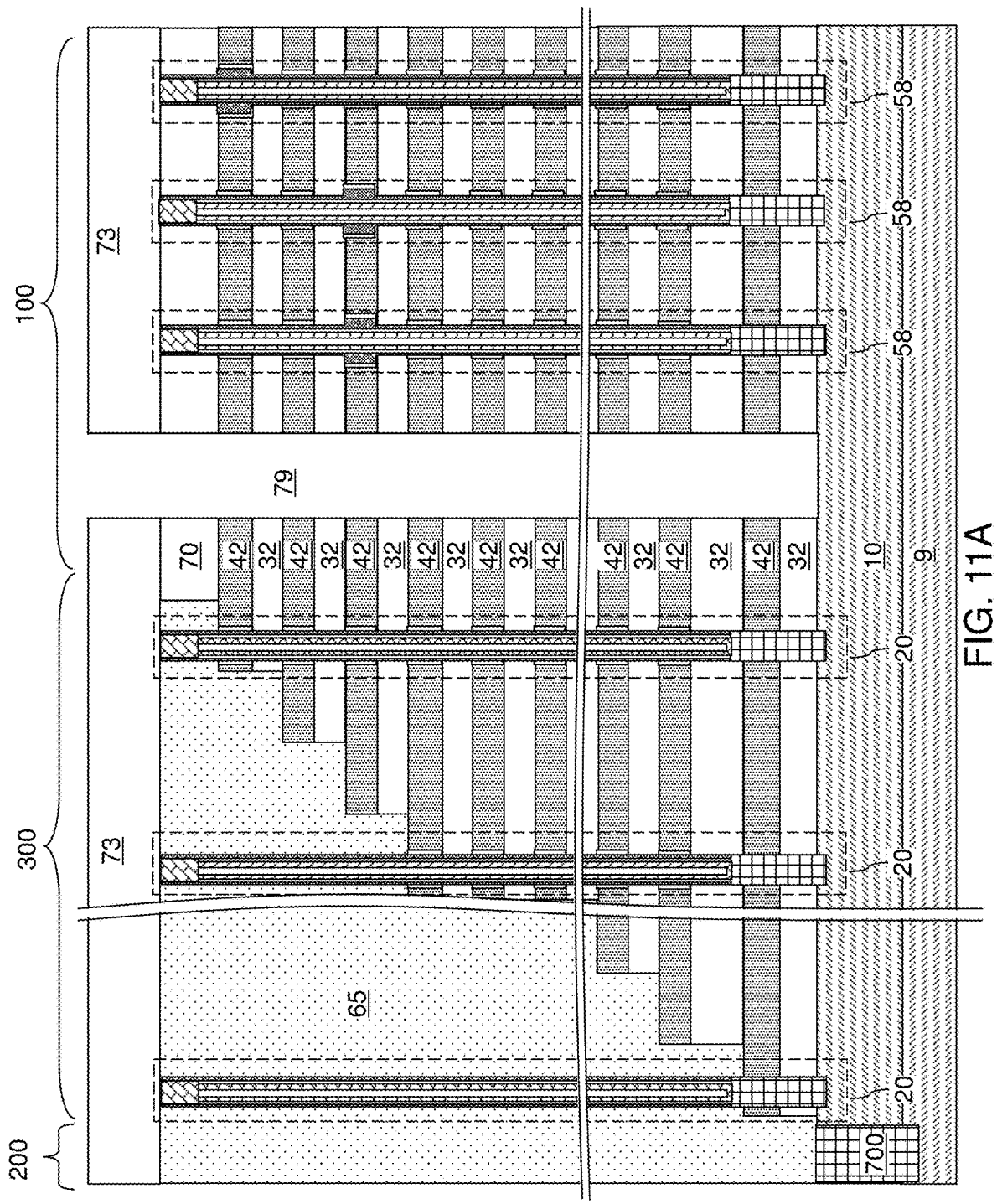
FIG. 11A is a vertical cross-sectional view of the exemplary structure after formation of backside trenches according to an embodiment of the present disclosure.
Figure 11B:
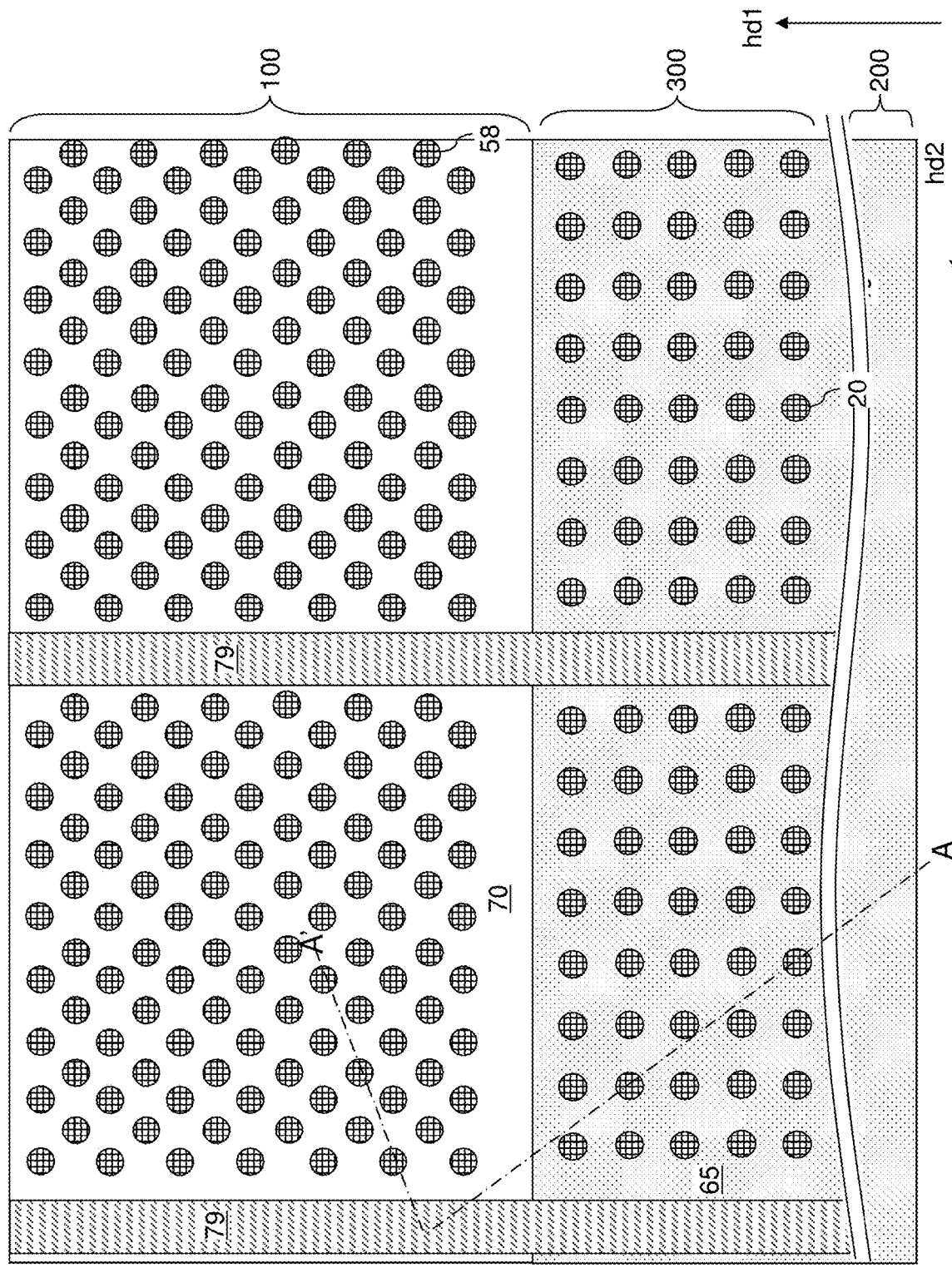
FIG. 11B is a vertical cross-sectional view of the exemplary structure along the hinged vertical plane B-B' of FIG. 11A. The horizontal plane B-B' is the plane of the horizontal cross-sectional view of FIG. 11A.

Referring to FIGS. 11A and 11B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. Each backside trench 79 can have a uniform width that is invariant along the lengthwise direction (i.e., along the first horizontal direction hd1). Multiple rows of memory stack structures 55 can be located between a neighboring pair of backside trenches 79. In one embodiment, the backside trenches 79 can include a source contact opening in which a source contact via structure can be subsequently formed. The photoresist layer can be removed, for example, by ashing.

Figure 12:
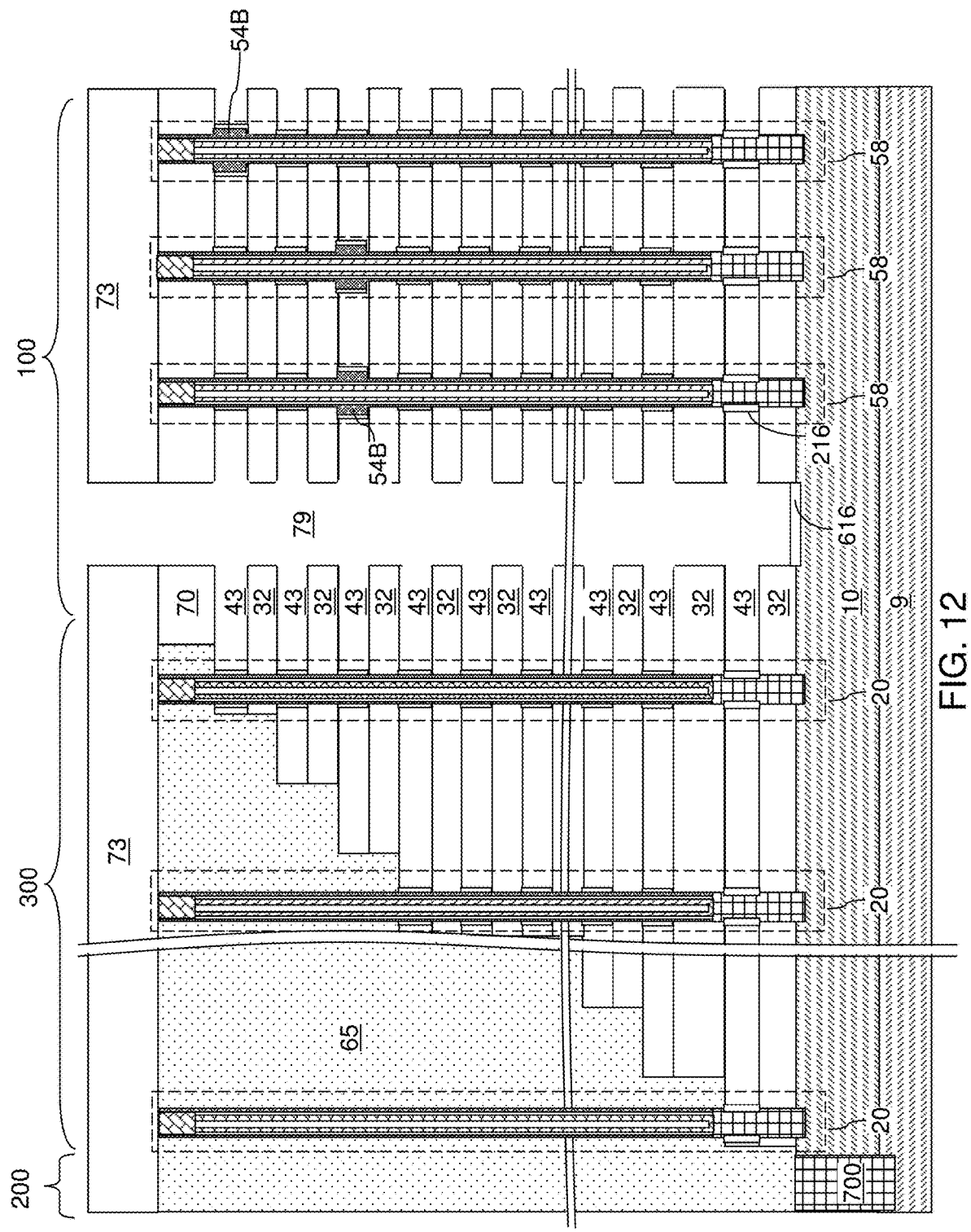
FIG. 12 is a vertical cross-sectional view of the exemplary structure after formation of backside recesses and tubular dielectric spacers according to an embodiment of the present disclosure.

Referring to FIG. 12, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 216, and to convert each physically exposed surface portion of the semiconductor material layer 10 into a planar dielectric portion 616. In one embodiment, each tubular dielectric spacer 216 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 216 include a dielectric material that includes the same semiconductor element as the pedestal channel portions 11 and additionally includes at least one non-metallic element such as oxygen and/or nitrogen such that the material of the tubular dielectric spacers 216 is a dielectric material. In one embodiment, the tubular dielectric spacers 216 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 13:
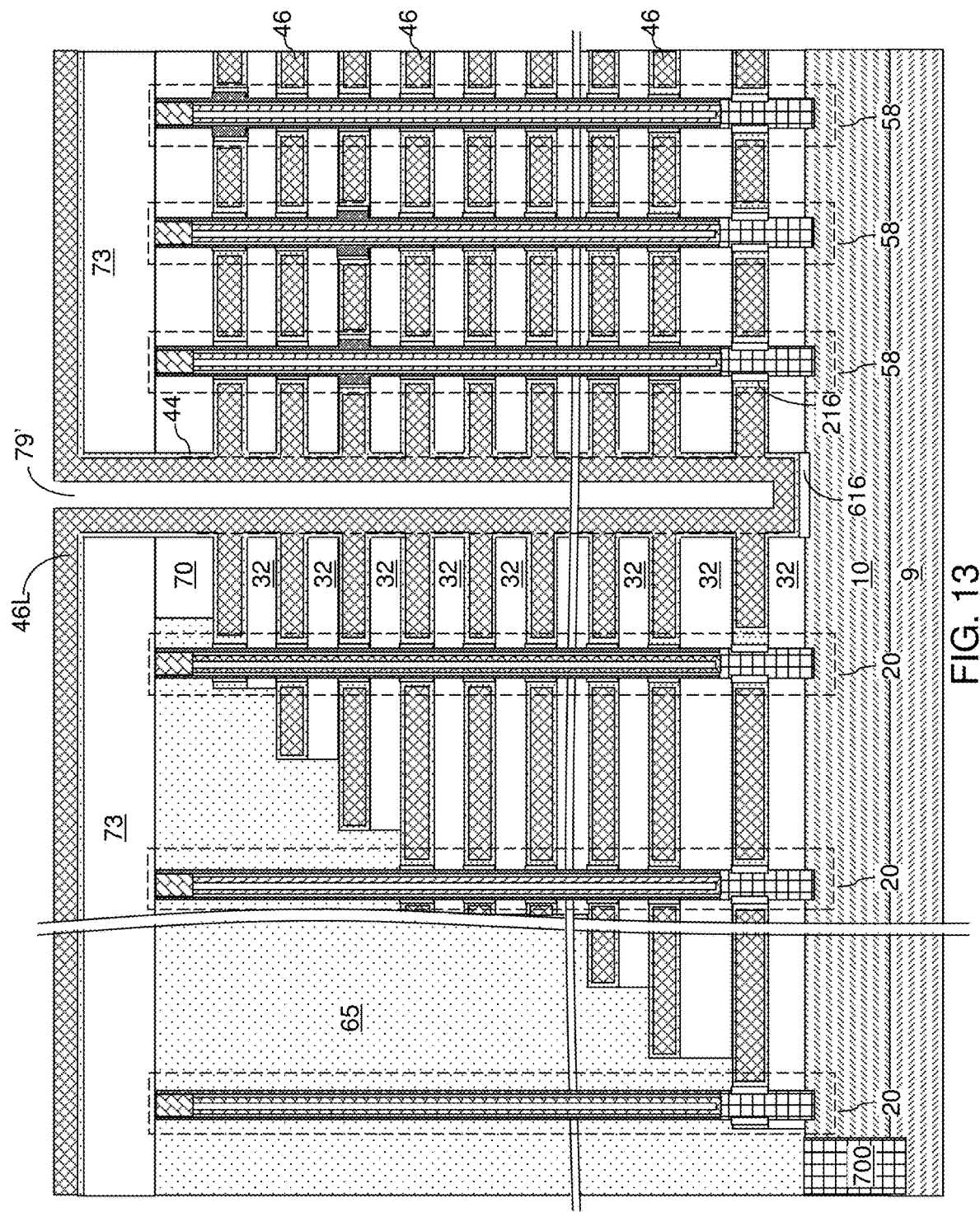
FIG. 13 is a vertical cross-sectional view of the exemplary structure after formation of electrically conductive layers according to an embodiment of the present disclosure.

Referring to FIG. 13, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 216 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

A metallic barrier layer can be deposited in the backside recesses 43. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in the plurality of backside recesses 43, on the sidewalls of the at least one the backside trench 79, and over the top surface of the contact level dielectric layer 73 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer and a portion of the metallic fill material layer that are located between a vertically neighboring pair of dielectric material layers such as a pair of insulating layers 32. The continuous metallic material layer 46L includes a continuous portion of the metallic barrier layer and a continuous portion of the metallic fill material layer that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 216 laterally surrounds a pedestal channel portion 11. A bottommost electrically conductive layer 46 laterally surrounds each tubular dielectric spacer 216 upon formation of the electrically conductive layers 46.

Figure 14:
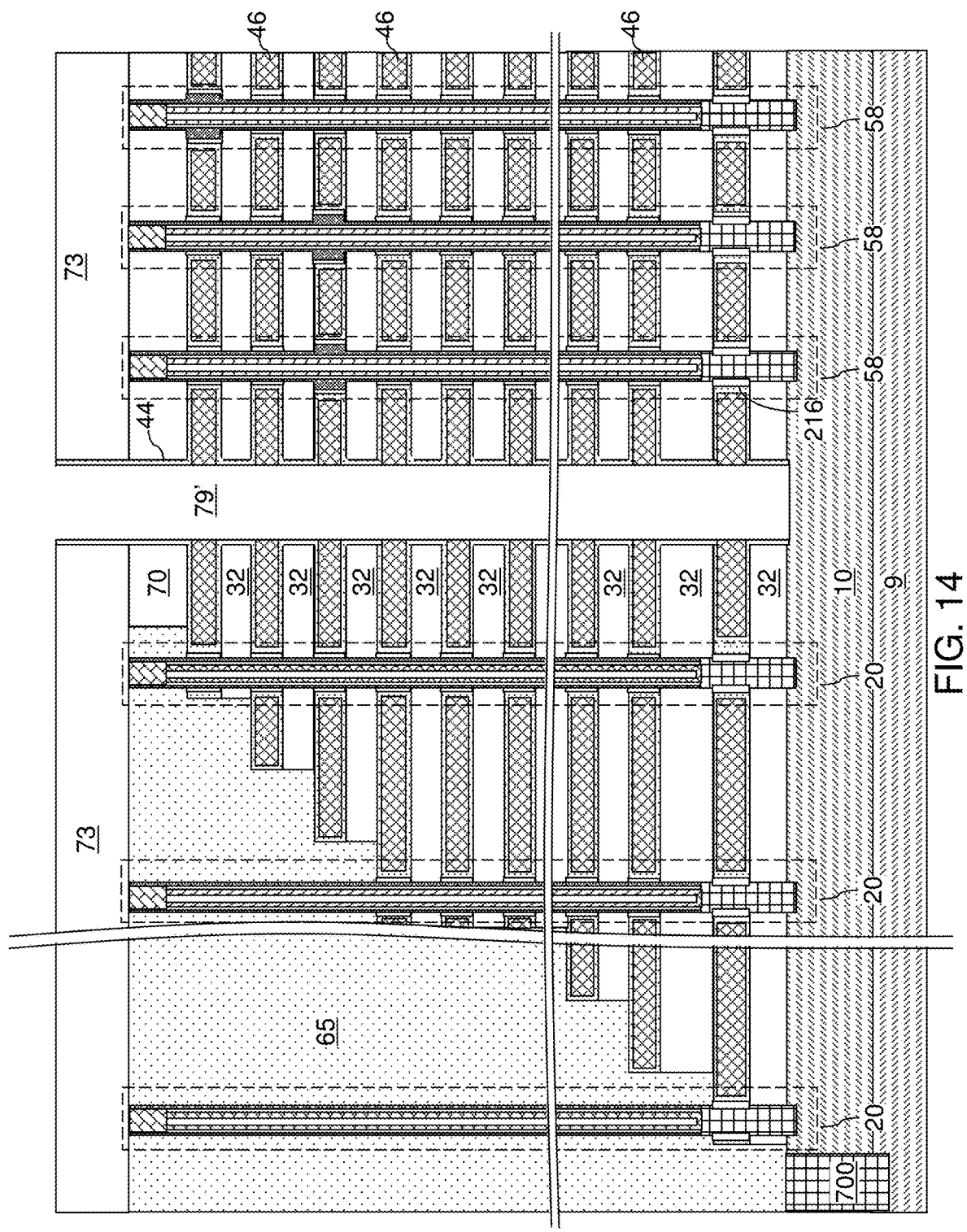
FIG. 14 is a vertical cross-sectional view of the exemplary structure after removal of a deposited conductive material from within the backside trenches according to an embodiment of the present disclosure.

Referring to FIG. 14, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench

79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 15:
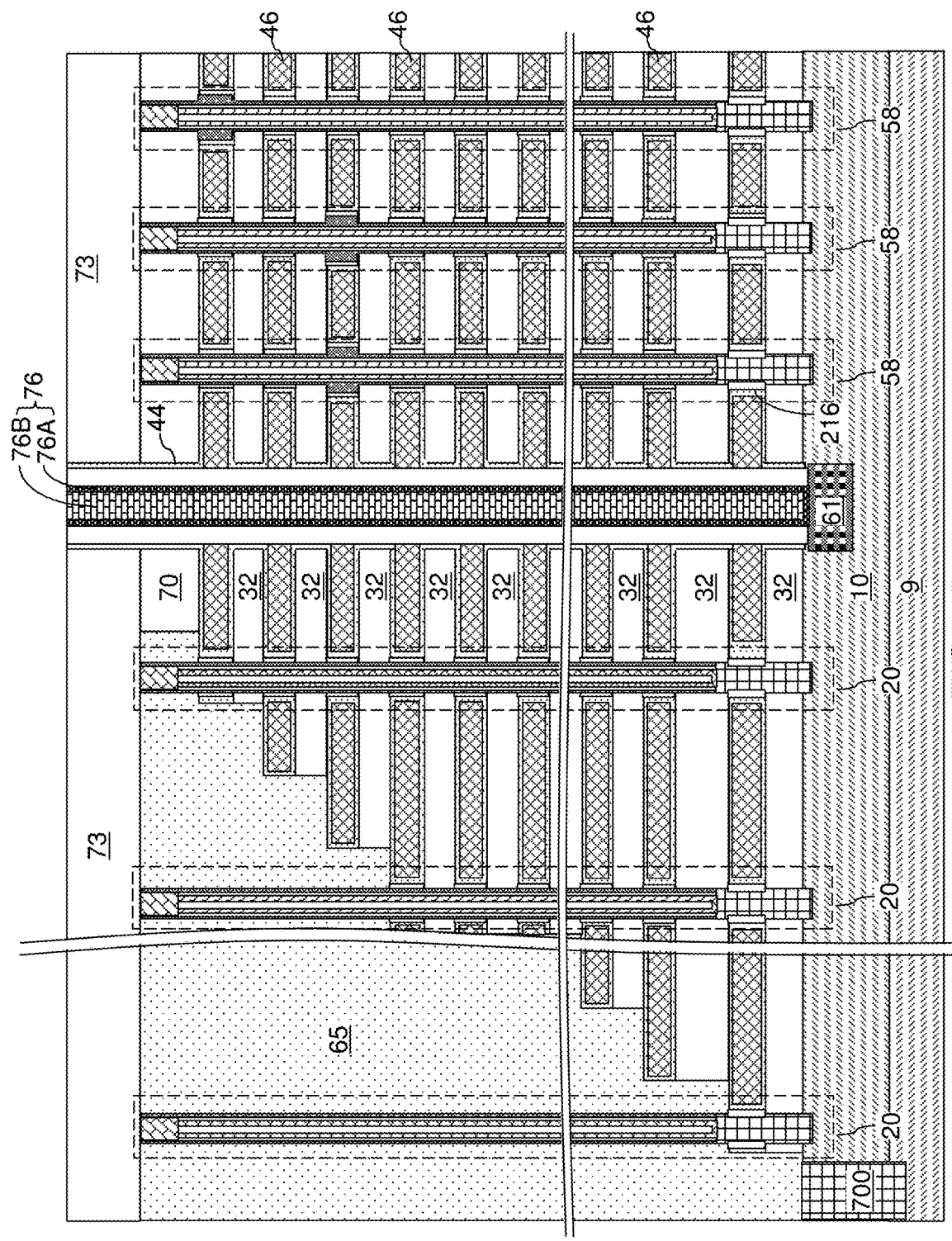
FIG. 15 is a schematic vertical cross-sectional view of the exemplary structure after formation of an insulating spacer and a backside contact structure within each backside trench according to an embodiment of the present disclosure.

Referring to FIG. 15, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 16A:
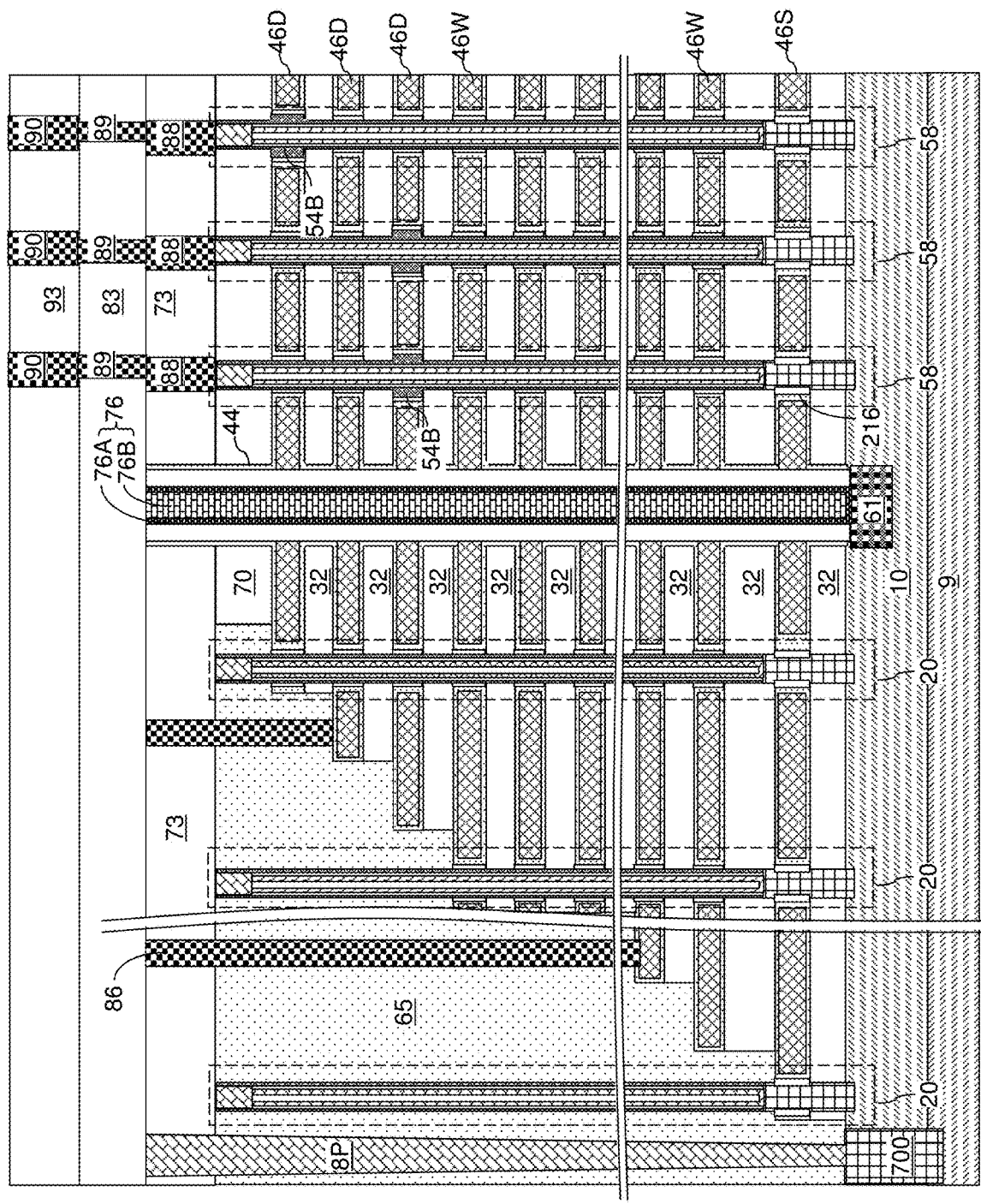
FIG. 16A is a schematic vertical cross-sectional view of the exemplary structure after formation of additional contact via structures according to an embodiment of the present disclosure.
Figure 16B:
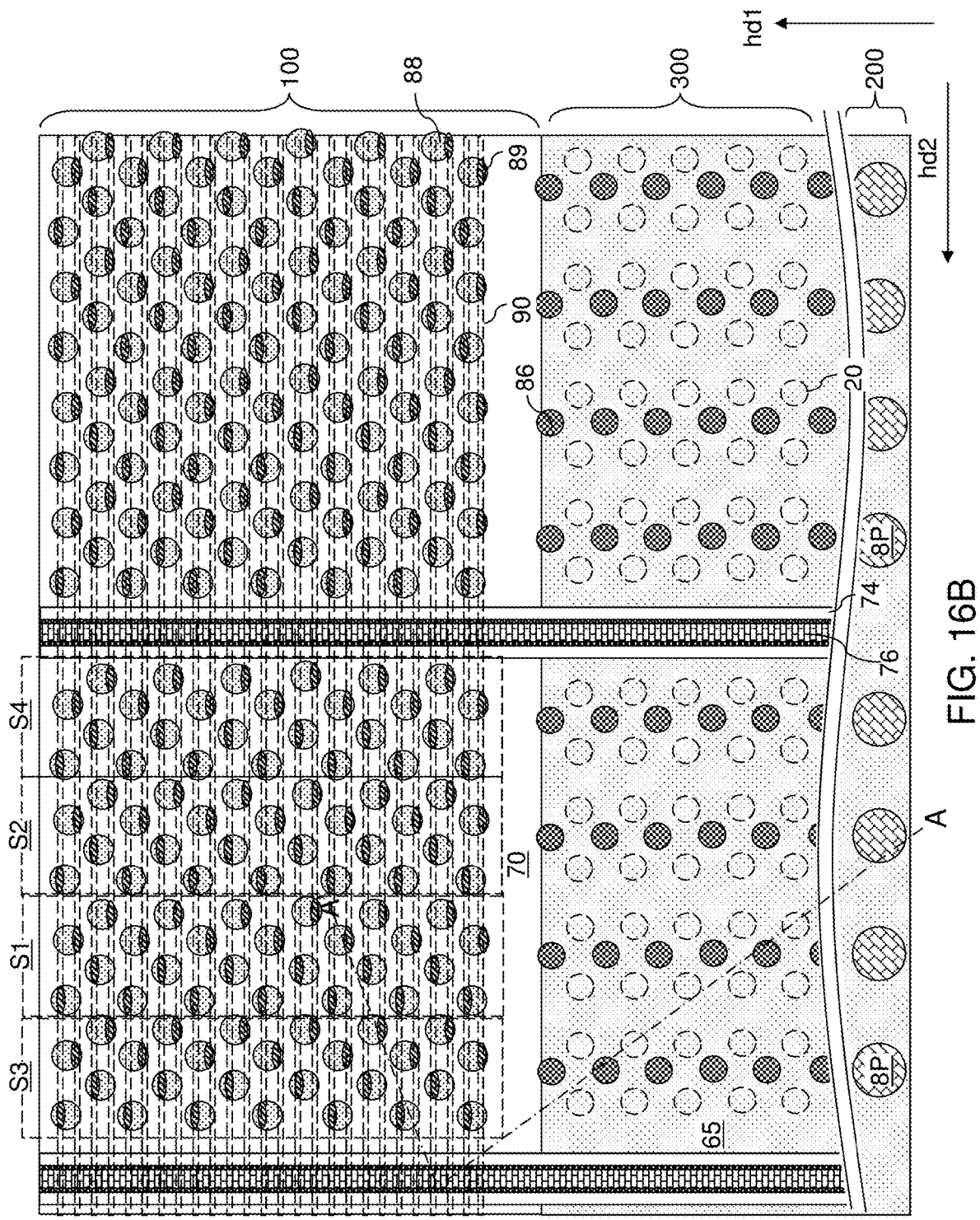
FIG. 16B is a top-down, partial see-through view of the exemplary structure of FIG. 16A. The vertical plane A-A' is the plane of the schematic vertical cross-sectional view of FIG. 16A.

Referring to FIGS. 16A and 16B, the electrically conductive layers 46 comprise word lines 46W, drain select gate electrodes 46D located above the word lines 46W and one or more source select gate electrodes 46S located below the word lines 46W. The drain select gate electrodes 46D and source select gate electrode(s) 46S comprise gate electrodes of respective drain and source select transistors of vertical NAND memory strings. The word lines 46W function as control gate electrodes of memory cells in the vertical NAND memory strings.

Additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Bit line connection via structures 89 can be formed on each of the drain contact via structures 88. The bit line connection via structures can be embedded within a via level dielectric material layer 83 that overlies the contact level dielectric layer 73. The bit line connection via structures 89 can be elongated along the second horizontal direction hd2 to enable dense bit line wiring in an overlying level.

Bit lines 90 laterally extending along the second horizontal direction hd2 (i.e., bit line direction) can be formed on the bit line connection via structures 89. The bit lines 90 can be embedded within a line level dielectric layer 93 that overlies the via level dielectric material layer 83. The bit lines 90 can extend over multiple backside trenches 79 and multiple blocks of memory stack structures 55, each block including respective strings (S1, S2, S3, S4) of memory stack structures 55. In one embodiment, each bit line 90 can contact only one of the memory stack structures 55 within each string (S1, S2, S3, S4) of memory stack structures 55 per block of memory stack structures 55. Each block of memory stack structures 55 can include an entire set of memory stack structures 55 located between a neighboring pair of backside trenches 79.

In the embodiment illustrated in FIG. 16A, each memory stack structure 55 contains only one bulging region 54B. In this embodiment, each drain select transistor contains only one drain select gate electrode 46D. In an alternative embodiment illustrated in FIGS. 17A and 17B, each drain select transistor contains plural, vertically separated drain select electrodes 46D. In the alternative embodiment, each memory stack structure 55 contains plural bulging regions 54B at the levels of each drain select gate electrode 46D of one drain select transistor (111, 114).

Referring to FIGS. 16A, 16B, 17A and 17B, a three-dimensional NAND memory device contains an alternating stack of insulating layers 32 and electrically conductive word line layers 46W located over a substrate (9, 10). At least one first drain select gate electrode 46D (e.g., SGD1) is located over the alternating stack (32, 46W) and extending through a first drain select transistor 111 and a second drain select transistor 112, at least one second drain select gate electrode 46 (e.g., SGD2) is located between the first drain select electrode SGD1 and the alternating stack (32, 46W) and extending through a third drain select transistor 113 and a fourth drain select transistor 114. The drain select transistors are shown in dashed lines in FIGS. 17A and 17B. Each drain select transistor may be a multi drain select gate transistor (e.g., having more than two drain select gate electrodes, such as three drain select gate electrodes shown in FIGS. 17A and B) or a single drain select gate transistor (e.g., as shown in FIG. 16A). The first drain select transistor 111 and the third drain select transistor 113 are located in a first NAND memory string (string 1). The second drain select transistor 112 and the fourth drain select transistor 114 are located in a second NAND memory string (string 2) different from the first NAND memory string. The first drain select transistor 111 has a higher threshold voltage than the second drain select transistor 112. The third drain select 113 transistor has a lower threshold voltage than the fourth drain select transistor 114.

As described above with respect to FIG. 16A, a bit line 90 is electrically connected by first drain contact via structure 88 to a first memory stack structure 55A in the first NAND memory string (string 1) and is electrically connected by a second drain contact via structure 88 to a second memory stack structure 55 in the second NAND memory string (string 2). The first memory stack structure 55 comprises a first vertical semiconductor channel 60 surrounded by first charge storage elements 54 and the second memory stack structure 55 comprises a second vertical semiconductor channel 60 surrounded by second charge storage elements 54 having a smaller thickness than the first charge storage elements. The word lines 46W contact the first memory stack structure 55 and the second memory stack structure 55 without being cut by a trench 79 or a dielectric isolation structure.

Figure 17A:
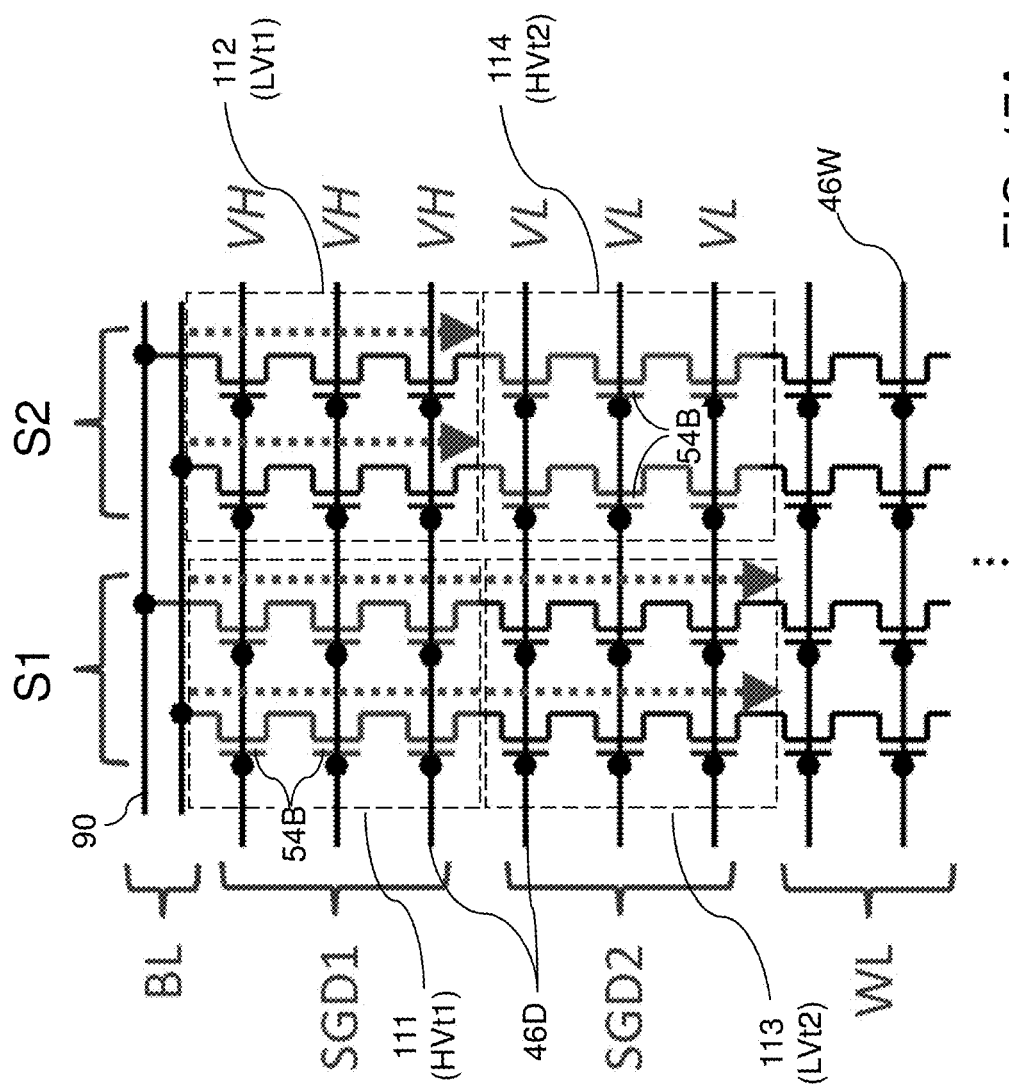
FIG. 17A is a circuit diagram during selection of string S1 of an alternative multi drain select gate configuration of the exemplary structure of FIGS. 16A-16B.

Referring to FIG. 17A, a circuit diagram with a bias voltage scheme is illustrated during selection of string 1 of the first configuration of the exemplary structure of FIGS. 16A-16B. The source regions 61 can be biased at 0 V, and a selected bit line 90 of a plurality of bit lines BL can be biased at a drain-to-source bias voltage. If the vertical semiconductor channels 60 include p-type channels, the selected bit line can be biased, for example, with a drain-to-source bias voltage in a range from 1 V to 6 V. If the vertical semiconductor channels 60 include n-type channels, the selected bit line can be biased, for example, with a drain-to-source bias voltage in a range from −1 V to −6 V. The various threshold voltages for turning on portions of a respective vertical semiconductor channel 60 are marked as HVt and LVt, which represent a high threshold voltage and a low threshold voltage, respectively.

Portions of the vertical semiconductor channels 60 of string 1 at the level(s) of the first select gate electrode SGD1 have a first high threshold voltage HVt1 for the first select gate electrode SGD1. Portions of the vertical semiconductor channels 60 of string 2 at the level(s) of the first select gate electrode SGD1 have a first low threshold voltage LVt1 for the first select gate electrode SGD1. The first high threshold voltage HVt1 is greater in magnitude than the first low threshold voltage LVt1. For example, if the vertical semiconductor channels 60 are p-type channels, the first high threshold voltage HVt1 can be in a range from 2 V to 20 V and the first low threshold voltage LVt1 can be in a range from 0.1 V to 5 V. Alternatively, if the vertical semiconductor channels 60 are n-type channels, the first high threshold voltage HVt1 can be in a range from −2 V to −20 V and the first low threshold voltage LVt1 can be in a range from −0.1 V to −5 V. Portions of the vertical semiconductor channels 60 of string 1 at the level(s) of the second select gate electrode SGD2 have a second low threshold voltage LVt2 for the second select gate electrode SGD2. Portions of the vertical semiconductor channels 60 of string 2 at the level(s) of the second select gate electrode SGD2 have a second high threshold voltage HVt2 for the second select gate electrode SGD2. Thus, the first string (string 1) and the second string (string 2) have opposite high and low threshold voltages for each of the first and second select gate electrodes. The second high threshold voltage HVt2 is greater in magnitude than the second low threshold voltage LVt2. For example, if the vertical semiconductor channels 60 are p-type channels, the second high threshold voltage HVt2 can be in a range from 2 V to 20 V and the second low threshold voltage LVt2 can be in a range from 0.2 V to 5 V. Alternatively, if the vertical semiconductor channels 60 are n-type channels, the second high threshold voltage HVt2 can be in a range from −2 V to −20 V and the second low threshold voltage LVt2 can be in a range from −0.2 V to −5 V.

To select the memory stack structure 55 within string 1, the first select gate electrode SGD1 laterally surrounding string 1 (and string 2) can be electrically biased at a high drain select gate bias voltage VH, which is greater in magnitude than a first high threshold voltage HVt1 for the first select gate electrode SGD1 and which is sufficient to turn on the portions of the vertical semiconductor channels 60 of string 1 (and of string 2) at the level(s) of the first select gate electrode SGD1. Application of the high drain select gate bias voltage VH to the first select gate electrode SGD1 turns on the portions of the vertical semiconductor channels 60 at the level(s) of the first select gate electrode SGD1 for each memory stack structure 55 in string 1 and string 2. Concurrently, the second select gate electrode SGD2 laterally surrounding string 1 (and string 2) can be electrically biased at a low drain select gate bias voltage VL, which is greater in magnitude than a second low threshold voltage LVt2 for the second select gate electrode SGD2 and which is sufficient to turn on the portions of the vertical semiconductor channels 60 of string 1 at the level(s) of the second select gate electrode SGD2, and is less in magnitude than a second high threshold voltage HVt2 that is sufficient to turn on the portions of the vertical semiconductor channels 60 of string 2 at the level(s) of the second select gate electrode SGD2. Application of the low drain select gate bias voltage VL to the second select gate electrode SGD2 turns on the portions of the vertical semiconductor channels 60 at the level(s) of the second select gate electrode SGD2 for each memory stack structure 55 in string 1, but is insufficient to turn on the portions of the vertical semiconductor channels 60 at the level(s) of the second select gate electrode SGD2 for each memory stack structure 55 in string 2.

Thus, the vertical semiconductor channels 60 of string 1 are turned on at the levels of the first select gate electrode SGD1 and the second select gate electrode SGD2, as shown by the dashed arrows on the left, while the vertical semiconductor channels 60 of string 2 are turned on at the levels of the first select gate electrode SGD1 and are turned off at the levels of the second select gate electrode SGD2, as shown by the dashed arrows on the right. Therefore, the biasing scheme of FIG. 17A turns on the vertical semiconductor channels 60 of string 1 through the levels of the first and second select gate electrodes (SGD1, SGD2), and turns off the vertical semiconductor channels 60 of string 2 through the levels of the first and second select gate electrodes (SGD1, SGD2).

Figure 17B:
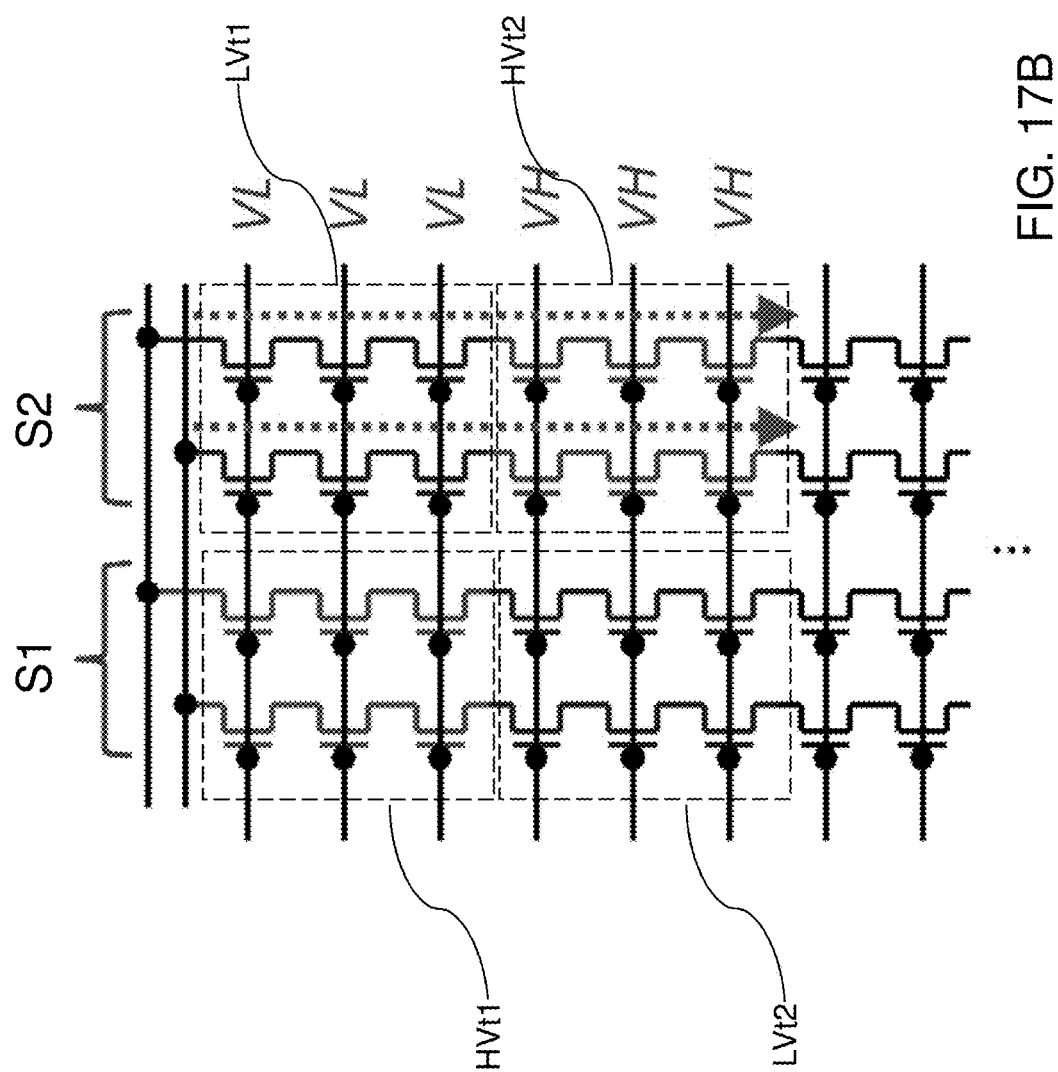
FIG. 17B is a circuit diagram during selection of string S2 of the alternative configuration of the exemplary structure of FIGS. 16A-16B.

Referring to FIG. 17B, a circuit diagram with a bias voltage scheme is illustrated during selection of string 2 of the first configuration of the exemplary structure of FIGS. 16A-16B. The source regions 61 can be biased at 0 V, and a selected bit line 90 of a plurality of bit lines BL can be biased at a drain-to-source bias voltage. The biasing schemes for the source and the drain of the vertical field effect transistors can be the same as in FIG. 17A.

To select the memory stack structure 55 within string 2, the first select gate electrode SGD1 laterally surrounding string 2 (and string 1) can be electrically biased at a low drain select gate bias voltage VL, which is greater in magnitude than the first low threshold voltage LVt1 for the first select gate electrode SGD1 and which is sufficient to turn on the portions of the vertical semiconductor channels 60 of string 2 at the level(s) of the first select gate electrode SGD1, and is less in magnitude than the first high threshold voltage HVt1 that is sufficient to turn on the portions of the vertical semiconductor channels 60 of string 1 at the level(s) of the first select gate electrode SGD1. Application of the low drain select gate bias voltage VL to the first select gate electrode SGD1 turns on the portions of the vertical semiconductor channels 60 at the level(s) of the first select gate electrode SGD1 for each memory stack structure 55 in string 2, but is insufficient to turn on the portions of the vertical semiconductor channels 60 at the level(s) of the first select gate electrode SGD1 for each memory stack structure 55 in string 1. Concurrently, the second select gate electrode SGD2 laterally surrounding string 2 (and string 1) can be electrically biased at a high drain select gate bias voltage VH, which is greater in magnitude than the second high threshold voltage HVt2 for the second select gate electrode SGD2 and which is sufficient to turn on the portions of the vertical semiconductor channels 60 of string 2 (and of string 1) at the level(s) of the second select gate electrode SGD2. Application of the high drain select gate bias voltage VH to the second select gate electrode SGD2 turns on the portions of the vertical semiconductor channels 60 at the level(s) of the second select gate electrode SGD2 for each memory stack structure 55 in string 1 and string 2, as shown by the dashed arrows.

Thus, the vertical semiconductor channels 60 of string 2 are turned on at the levels of the first select gate electrode SGD1 and the second select gate electrode SGD2, while the vertical semiconductor channels 60 of string 1 are turned on at the levels of the second select gate electrode SGD2 and is turned off at the levels of the first select gate electrode SGD1. Therefore, the biasing scheme of FIG. 17B turns on the vertical semiconductor channels 60 of string 2 through the levels of the first and second select gate electrodes (SGD1, SGD2), and turns off the vertical semiconductor channels 60 of string 1 through the levels of the first and second select gate electrodes (SGD1, SGD2). By selecting one of the bias schemes of FIG. 17A and FIG. 17B, string 1 or string 2 can be alternatively selected for programming and/or reading.

Referring to all drawings and according to various embodiments of the present disclosure, a three-dimensional memory device includes an alternating stack of insulating layers 32 and electrically conductive layers 46 containing word lines 46W and drain select gate electrodes 46D located over a substrate (9, 10), and memory stack structures 55 containing a respective vertical semiconductor channel 60 and a memory film 50 including a tunneling dielectric 56 and a charge storage layer 54. A first portion of a first charge storage layer 54 located in a first memory stack structure 55 at level of a first drain select gate electrode 46D (e.g., SGD1 in FIG. 17A) is thicker than a first portion of a second charge storage layer 54 located in a second memory stack structure 55 at the level of the first drain select electrode 46D (e.g., SGD1).

In one embodiment shown in FIGS. 17A and 17B, the first memory stack structure 55 is located in a first memory string S1 and the second memory stack structure 55 is located in a second memory string S2 different from the first memory string S1. A second portion of the second charge storage layer 54 located in the second memory stack structure 55 at a level of a second drain select gate electrode 46D (e.g., SGD2 in FIG. 17A) is thicker than a second portion of the first charge storage layer 54 located in the first memory stack structure 55 at the level of the second drain select electrode 46D (e.g., SGD2). The second drain select electrode 46D (e.g., SGD2) is vertically located between the word lines 46W and the first drain select gate electrode 46D (e.g., SGD1).

In one embodiment shown in FIGS. 17A and 17B, the first memory string S1 comprises a first drain select transistor 111 comprising a first portion of the first drain select gate electrode 46D (e.g., SGD1), the first portion 54B of the first charge storage layer 54, and a first portion of the first memory stack structure 55. The first memory string S1 also comprises a second drain select transistor 113 located below the first drain select transistor 111 and comprising a first portion of the second drain select gate electrode 46D (e.g., SGD2), the second portion of the first charge storage layer 54, and a second portion of the first memory stack structure 55.

The second memory string S2 comprises a third drain select transistor 112 comprising a second portion of the first drain select gate electrode 46D (e.g., SGD1), the first portion of the second charge storage layer 54, and a first portion of the second memory stack structure 55. The second memory string S2 also comprises a fourth drain select transistor 114 located below the third drain select transistor 112 and comprising a second portion of the second drain select gate electrode 46D (e.g., SGD2), the second portion 54B of the second charge storage layer 54, and a second portion of the second memory stack structure 55.

In one embodiment, the first portion 54B of the first charge storage layer is thicker than the second portion of the first charge storage layer and the first portion of the second charge storage layer, while the second portion 54B of the second charge storage layer is thicker than the first portion of the second charge storage layer. The first drain select transistor 111 has a higher threshold voltage than the second and the third drain select transistors (113, 112). The fourth drain select transistor 114 has a higher threshold voltage than the third drain select transistor 112.

In one embodiment, bit lines 90 overlie the memory stack structures 55. Each of the bit lines 90 is electrically connected to a top end of only one memory stack structure 55 in one memory string S1 of the memory stack structures 55 and to a top end of only one memory stack structure 55 in another memory string S2 of the memory stack structures 55. Generally, each bit line 90 can be electrically connected to a top end of only one memory stack structure 55 per memory string (S1, S2, S3, S4) of memory stack structures 55 per block of memory stack structures 55.

In one embodiment, the first memory stack structure 55 comprises a first memory film 50 having a first laterally bulging portion 54B at the level of the first drain select gate electrode 46D (e.g., SGD1), and the second memory stack structure 55 comprises a second memory film 50 having a laterally bulging portion 54B at the level of the second drain select gate electrode 46D (e.g., SGD2). The first laterally bulging portion 54B comprises the first portion of the first charge storage layer 54, and the second laterally bulging portion 54B comprises a bulging second portion of the second charge storage layer 54.

In one embodiment, each laterally bulging portion 54B of the first and second memory films 50 includes a respective cylindrical outer sidewall and a respective cylindrical inner sidewall. Each laterally bulging portion 54B of the first and second memory films 50 includes a respective annular bottom surface that contacts a top surface of a respective underlying one of the insulating layers 32. Each of the first and second memory films 50 includes a straight inner cylindrical sidewall that vertically extends through drain select gate transistors (111, 112, 113, 114) without lateral undulation.

In one embodiment, the alternating stack comprises a terrace region in which each electrically conductive layer 46 other than the topmost one of the electrically conductive layers 46 within the alternating stack laterally extends farther than any overlying electrically conductive layer 46 within the alternating stack. The terrace region includes stepped surfaces of the alternating stack that continuously extend at least from a bottommost one of the electrically conductive layers 46 within the alternating stack to the topmost one of the electrically conductive layers 46 within the alternating stack. A retro-stepped dielectric material portion 65 overlies the stepped surfaces of the alternating stack.

In one embodiment, support pillar structures 20 extend through the retro-stepped dielectric material portion 65 and an underlying region of the alternating stack. Each of the support pillar structures 20 includes a straight outermost sidewall that extends from a horizontal plane including a top surface of the retro-stepped dielectric material portion 65 to another horizontal plane including a bottommost surface of the alternating stack.

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (comprising at least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels (59, 11, 60).

The three-dimensional memory device of embodiments of present disclosure enables selection of string of memory stack structure 55 within each block of memory stack structures 55 between a neighboring pair of backside trenches 79. The selection of different strings of memory stack structures 55 is provided by thicker charge storage regions which increase the threshold voltage of some drain select transistors compared to other drain select transistors having thinner charge storage regions. The thicker charge storage regions (e.g., bulging portions 54B of the charge storage layer 54) provide locally enhanced threshold voltages for the vertical semiconductor channels 60 of some drain select transistors. Formation of drain select level isolation structures is unnecessary for the three-dimensional memory device of the embodiments of the present disclosure. However, the three-dimensional memory device of the embodiments of the present disclosure may incorporate drain select level isolation structures, which are dielectric material portions laterally extending along the first horizontal direction hd1 and vertically extending through the drain select level. Each block of memory stack structures 55 between a neighboring pair of backside trenches 79 can be formed as a periodic two-dimensional array, i.e., as a two-dimensional "on-pitch" structure having a first pitch along the first horizontal direction hd1 and a second pitch along the second horizontal direction hd2. By forming a three-dimensional memory array as on-pitch structures, the footprint of the three-dimensional memory array can be minimized, and the three-dimensional memory array can be formed as a compact semiconductor device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
    an alternating stack of insulating layers and electrically conductive layers comprising word lines and drain select gate electrodes located over a substrate; and
    memory stack structures comprising a respective vertical semiconductor channel and a memory film comprising a tunneling dielectric and a charge storage layer;
    wherein:
    a first portion of a first charge storage layer located in a first memory stack structure at level of a first drain select gate electrode is thicker than a first portion of a second charge storage layer located in a second memory stack structure at the level of the first drain select electrode;
    the first memory stack structure is located in a first memory string and the second memory stack structure is located in a second memory string different from the first memory string;
    a second portion of the second charge storage layer located in the second memory stack structure at a level of a second drain select gate electrode is thicker than a second portion of the first charge storage layer located in the first memory stack structure at the level of the second drain select electrode;
    the second drain select electrode is vertically located between the word lines and the first drain select gate electrode;
    the first memory string comprises:
        a first drain select transistor comprising a first portion of the first drain select gate electrode, the first portion of the first charge storage layer, and a first portion of the first memory stack structure, and
        a second drain select transistor located below the first drain select transistor and comprising a first portion of the second drain select gate electrode, the second portion of the first charge storage layer, and a second portion of the first memory stack structure; and
    the second memory string comprises:
        a third drain select transistor comprising a second portion of the first drain select gate electrode, the first portion of the second charge storage layer, and a first portion of the second memory stack structure, and
        a fourth drain select transistor located below the third drain select transistor and comprising a second portion of the second drain select gate electrode, the second portion of the second charge storage layer, and a second portion of the second memory stack structure.

2. The three-dimensional memory device of claim 1, wherein:
    the first portion of the first charge storage layer is thicker than the second portion of the first charge storage layer and the first portion of the second charge storage layer;
    the second portion of the second charge storage layer is thicker than the first portion of the second charge storage layer;
    the first drain select transistor has a higher threshold voltage than the second and the third drain select transistors; and
    the fourth drain select transistor has a higher threshold voltage than the third drain select transistor.

3. The three-dimensional memory device of claim 1, further comprising bit lines overlying the memory stack structures, wherein each of the bit lines is electrically connected to a top end of only one memory stack structure in the first memory string and to a top end of only one memory stack structure in the second memory string.

4. The three-dimensional memory device of claim 1, wherein:
    the first memory stack structure comprises a first memory film having a first laterally bulging portion at the level of the first drain select gate electrode; and
    the second memory stack structure comprises a second memory film having a laterally bulging portion at the level of the second drain select gate electrode.

5. The three-dimensional memory device of claim 4, wherein:
    the first laterally bulging portion comprises the first portion of the first charge storage layer; and
    the second laterally bulging portion comprises a bulging second portion of the second charge storage layer.

6. The three-dimensional memory device of claim 4, wherein each laterally bulging portion of the first and second memory films includes a respective cylindrical outer sidewall and a respective cylindrical inner sidewall.

7. The three-dimensional memory device of claim 4, wherein each laterally bulging portion of the first and second memory films includes a respective annular bottom surface that contacts a top surface of a respective underlying one of the insulating layers.

8. The three-dimensional memory device of claim 4, wherein each of the first and second memory films includes a straight inner cylindrical sidewall that vertically extends through drain select gate transistors without lateral undulation.

* * * * *